United States Patent [19]
Yoshitomi

[11] Patent Number: 6,075,266
[45] Date of Patent: Jun. 13, 2000

[54] SEMICONDUCTOR DEVICE HAVING MIS TRANSISTORS AND CAPACITOR

[75] Inventor: Takashi Yoshitomi, Kamakura, Japan

[73] Assignee: Kabushiki Kaisha Toshiba, Kawasaki, Japan

[21] Appl. No.: 09/004,781

[22] Filed: Jan. 9, 1998

[30] Foreign Application Priority Data

Jan. 9, 1997 [JP] Japan .................................. 9-001978

[51] Int. Cl.[7] .......................... H01L 27/108; H01L 29/76; H01L 29/94; H01L 31/119
[52] U.S. Cl. .......................... 257/306; 257/307; 257/532; 257/296
[58] Field of Search ................................... 257/379, 532, 257/377, 306, 307, 296, 413

[56] References Cited

U.S. PATENT DOCUMENTS

| | | | |
|---|---|---|---|
| 5,065,220 | 11/1991 | Paterson et al. ........................... | 357/51 |
| 5,396,094 | 3/1995 | Matsuo ..................... | 257/310 |
| 5,814,852 | 9/1998 | Sandhu et al. ........................... | 257/310 |
| 5,847,424 | 12/1998 | Kang ........................................ | 257/306 |
| 5,894,160 | 4/1999 | Chan et al. .............................. | 257/412 |
| 5,933,719 | 8/1999 | Nii et al. ................................. | 438/202 |

*Primary Examiner*—David Hardy
*Assistant Examiner*—Jesse A. Fenty
*Attorney, Agent, or Firm*—Foley & Lardner

[57] ABSTRACT

The capacitor dielectric film (35) and the poly silicon layer (36) are formed on the silicide film (32) of the upper electrode LE of the capacitor. Further, after the Ti and TiN layer (37) has been formed on the poly silicon layer (36) by spattering, the formed Ti and TiN layer (37) is allowed to react upon the poly silicon layer (36), to form the $TiSi_2$ layer (38) of high melting point silicide film on the poly silicon layer (36). After that, before forming the barrier layer (40) and the wiring layer (42), the substrate (10) is cleaned as pre-processing by applying a voltage to the substrate (10). In this cleaning process, since the capacitor dielectric film (35) is protected by the $TiSi_2$ layer (38) of high melting point silicide film, it is possible to prevent the capacitor dielectric film (35) from being damaged during the cleaning process.

17 Claims, 34 Drawing Sheets

SEMICONDUCTOR DEVICE HAVING MIS TRANSISTORS AND CAPACITOR

BACKGROUND OF THE INVENTION

1. Field of the Invention

The present invention relates to a semiconductor device and a method of manufacturing the same semiconductor device, and more specifically to a semiconductor device having a capacitor and MIS transistors and a method of manufacturing the same.

2. Description of the Prior Art

FIGS. 18 to 22 show a prior art method of manufacturing a semiconductor device having a capacitor and MCS transistors. Here, however, the prior art manufacturing method as shown in these drawings is known by the Inventors in private, and therefore this prior art manufacturing method is not a prior art well known in public.

In FIG. 22, a capacitor Cap shown on the right side of the same drawing is a thin film condenser widely used an integrated condenser of an analog integrated circuit. This capacitor Cap is composed of an upper electrode UE, a lower electrode LE, and a dielectric film 35 sandwiched between the two electrodes UE and LE. In the semiconductor device having a capacitor Cap as described above, in order to reduce the number of the manufacturing steps and the number of the semiconductor layers, the lower electrode LE of the capacitor of two-layer structure and a gate electrode G of a MOS transistor of the same two-layer structure as shown on the left side of the same drawing are generally formed by use of two common layers. Further the upper electrode UE of the capacitor and some electrode wires 44 of the MOS transistor are generally formed by use of two common layers.

Here, the method of manufacturing the semiconductor device having the capacitor Cap as described above will be described hereinbelow briefly with reference to FIGS. 18 to 22.

First, as shown in FIG. 18, a p-well 12, an n-well 14 and an n-well 16 are formed on the surface of a silicon substrate 10. Furthers a plurality of element separating regions 20 are formed on the same surface of the substrate 10. On the left side in FIG. 18, an N-MOS transistor and a P-MOS transistor are formed at a portion sandwiched between the two element separating regions 20, respectively. Further, on the right side of FIG. 18, a capacitor Cap is formed on the element separating region 20 formed on the n-well 16. Here, since the structure of both the N-MOS transistor and the P-MOS transistor is basically the same with respect to each other, except the sort of its impurity type, only the N-MOS transistor will be mainly explained hereinbelow.

In the N-MOS transistor 12, an ohmic contact region 21, a source diffusion layer S, and a drain diffusion layer D are formed between the two element separating regions 20, respectively. This ohmic contact region 21 is formed to apply a voltage to the p-well 12. Further, a gate insulating film I is formed on a channel formed between the source diffusion layer S and the drain diffusion layer D. Further, a poly silicon Poly is formed on this gate insulating film I as a part of the gate electrode G. The gate electrode G is formed as a two-layer structure of the poly silicon Poly and a silicide film 22 (described later). The same process as explained above can be applied to the P-MOS transistor.

When the poly silicon Poly of the gate electrode G is formed, a poly silicon layer 30 is necessarily formed as the same layer, as shown on the right side in the same drawing.

In other words, the lower electrode LE of the capacitor is formed as a two-layer structure of the poly silicon layer 30 and the silicide film 32 (described later).

Further, a high melting point metal film formed of Co (Cobalt) is formed on the ohmic contact region 21, the source diffusion region S, the drain diffusion region D, the poly silicon Poly, and the poly silicon layer 30. After that, silicide film pieces 22 and 32 formed of $CoSi_2$ are selectively formed through a silicide process for performing selective etching on the basis of reaction between the high melting point metal film and the poly silicon layer, respectively. The silicide films 22 and 32 are formed to reduce the resistances of the gate electrode G formed mainly of poly silicon and the lower electrode LE of the capacitor Cap, respectively. The above-mentioned process has been well known, so that more detailed description thereof is omitted herein.

Further, a $SiO_2$ film 24 is formed all over the surface thereof by low pressure CVD (chemical vapor deposition) method. Further, the formed $SiO_2$ film 24 is etched by photo-lithography and RIE (reactive ion etching) to form a hole 31. By this process, it is possible to expose the silicide film 32 at a region in which the capacitor Cap is to be formed. In accordance with the above-mentioned process, an intermediate semiconductor device as shown in FIG. 18 can be obtained.

Further, as understood by FIG. 19, a $Si_3N_4$ layer 35A is formed all over the surface of the semiconductor device, that is, all over the $SiO_2$ film 24 formed as a cover and the silicide film 32 formed as a bottom of the hole 31 by an LPCVD (low pressure CVD) method.

Further, a part of the $Si_3N_4$ layer 35A is removed by photo-lithography and RIE, to leave the same layer 35A as a capacitor dielectric film 35. On the basis of the above-mentioned process, it is possible to obtain the intermediate semiconductor device as shown in FIG. 19. Further, as described above, when the $Si_3N_4$ layer 35A is removed by the RIE, since the silicide film pieces 22 formed on the ohmic contact region 21, the source diffusion layer S, and the drain diffusion layer D can be protected by the $SiO_2$ film 24, the silicide film pieces 22 are not damaged.

Further, as understood by FIG. 20, the $SiO_2$ film 24 is etched by the photo-lithography and RIE, to form some contact holes 26, so that it is possible to expose the silicide film pieces 22 at the bottoms of these formed contact holes 26. On the basis of the above-mentioned process, it is possible to obtain an intermediate semiconductor device as shown in FIG. 20. Further, although a hole reaching the gate electrode G has been formed, this gate electrode G is formed at a position not seen by the cross-sectional view shown in FIG. 20.

Further, as understood by FIG. 21, as pre-process of forming a barrier metal layer 40 and a wiring layer 42 (both described later), all over the surface of the intermediate semiconductor device is cleaned. In more detail, a reverse spattering processing is performed by etching the uppermost surface of the semiconductor device, while applying a voltage to the silicon substrate 10. Further, the barrier metal layer 40 formed of TiN and the wiring layer 42 formed of Al are formed both by spattering. By this process, it is possible to obtain an intermediate semiconductor device as shown in FIG. 21.

Further, as understood by FIG. 22, the barrier metal layer 40 and the wiring layer 42 are both patterned or etched by the photo-lithography and RIE, to form electrode wires 44 of both the N-type and P-type MOS transistors and the upper electrode UE of the capacitor Cap. By this process, it is possible to obtain an intermediate semiconductor device as shown in FIG. 22. On the basis of the above-mentioned process, although the wiring at the lowermost layer can be completed, it is of course necessary to put other wiring layers one upon another where necessary.

As described above, in the prior art manufacturing method, in order to reduce the contact resistance between the electrode wire 44 and each of the gate electrode G, the source diffusion electrode layer S and the drain diffusion layer D, respectively, as the pre-process of forming the barrier metal layer 40 and the wiring layer 42, the cleaning process is needed. In other words, it has been necessary to remove the high resistance oxide layer inevitably formed on the surfaces of the silicide film 22. In the intermediate semiconductor device sa shown in FIG. 20, however, since the silicide film pieces 22 are formed on the surfaces of the ohmic contact region 21, the source diffusion electrode layer S, the drain diffusion layer D and the gate electrode G, respectively, it has been impossible to perform the above-mentioned cleaning and HF (hydrofluoric acid) processing. That is, when the intermediate semiconductor device is cleaned by use of pure hydrofluoric acid, there exists a problem in that not only the high resistance oxide substance formed on the surface side thereof but also the silicide film pieces 22 are all etched. Therefore, as already explained, the uppermost surface of the semiconductor device has been so far etched by applying a voltage to the substrate, that is, by the method of the reverse spattering processing.

In this case, however, since the capacitor dielectric film 35 is inevitably damaged by this etching processing (cleaning processing), the insulation of the capacitor Cap degrades and thereby the long-term reliability of the semiconductor device also deteriorates. In other words, since the surface of the capacitor dielectric film 35 as shown in FIG. 20 is damaged by the etching process, a space between the lower electrode LE and the upper electrode UE of the capacitor Cap varies partially, with the result that there exists a problem in that the capacitance and the breakdown voltage of the capacitor Cap cannot be both uniformalized.

SUMMARY OF THE INVENTION

With these problems in mind, therefore, it is the object of the present invention to provide a semiconductor device having a capacitor Cap and MIS transistors, a method of manufacturing the same semiconductor device without damaging a capacitor dielectric film 32 when the MOS transistors are etched.

To achieve the above-mentioned object, the present invention provides a semiconductor device which comprises: a MOS transistor including: a source diffusion layer; a drain diffusion layer; a gate electrode formed on a channel between said source diffusion layer and said drain diffusion layer; at least two silicide film pieces formed on said source diffusion layer and said drain diffusion layer, respectively; and a wire electrode connected to at least one of said source diffusion layer and said drain diffusion layer via said silicide film piece; and a capacitor including: a lower electrode; a capacitor dielectric film formed on said lower electrode; a conductive protection film formed on said capacitor dielectric film; and an upper electrode formed on said conductive protection film.

Further, the present invention provides a method of manufacturing a semiconductor device formed with a MOS transistor having a source diffusion layer, a drain diffusion layer and a gate electrode formed on a channel between these two diffusion layers, and a capacitor having an upper electrode, a lower electrode and a capacitor dielectric film sandwiched between the two electrodes, which comprises: a step of forming a conductive protection film on the capacitor dielectric film; a step of cleaning a silicide film formed on the source diffusion layer and the drain diffusion layer, respectively; and a step of forming wiring electrodes of the MOS transistor.

Further, the present invention provides a method of manufacturing a semiconductor device formed with a MOS transistor having a source diffusion layer, a drain diffusion layer and a gate electrode formed on a channel between these two diffusion layers, and a capacitor having an upper electrode, a lower electrode and a capacitor dielectric film sandwiched between the two electrodes, which comprises: a step of forming poly silicon layer film pieces by patterning on a surface of the source diffusion layer, a surface of the drain diffusion layer, and a surface of the capacitor dielectric layer, respectively;

a step of forming a high melting point metal silicide film pieces on a surface of each of the formed poly silicon layer pieces; a step of cleaning surfaces of the high melting point metal silicide film pieces by etching while applying a voltage to a substrate of the semiconductor device; and a step of forming wiring electrodes of the MOS transistor.

DETAILED DESCRIPTION OF THE PREFERRED EMBODIMENTS (1st Embodiment)

A first embodiment of the semiconductor device according to the present invention will be described hereinbelow with reference to FIGS. 1 to 8.

Figure 6:
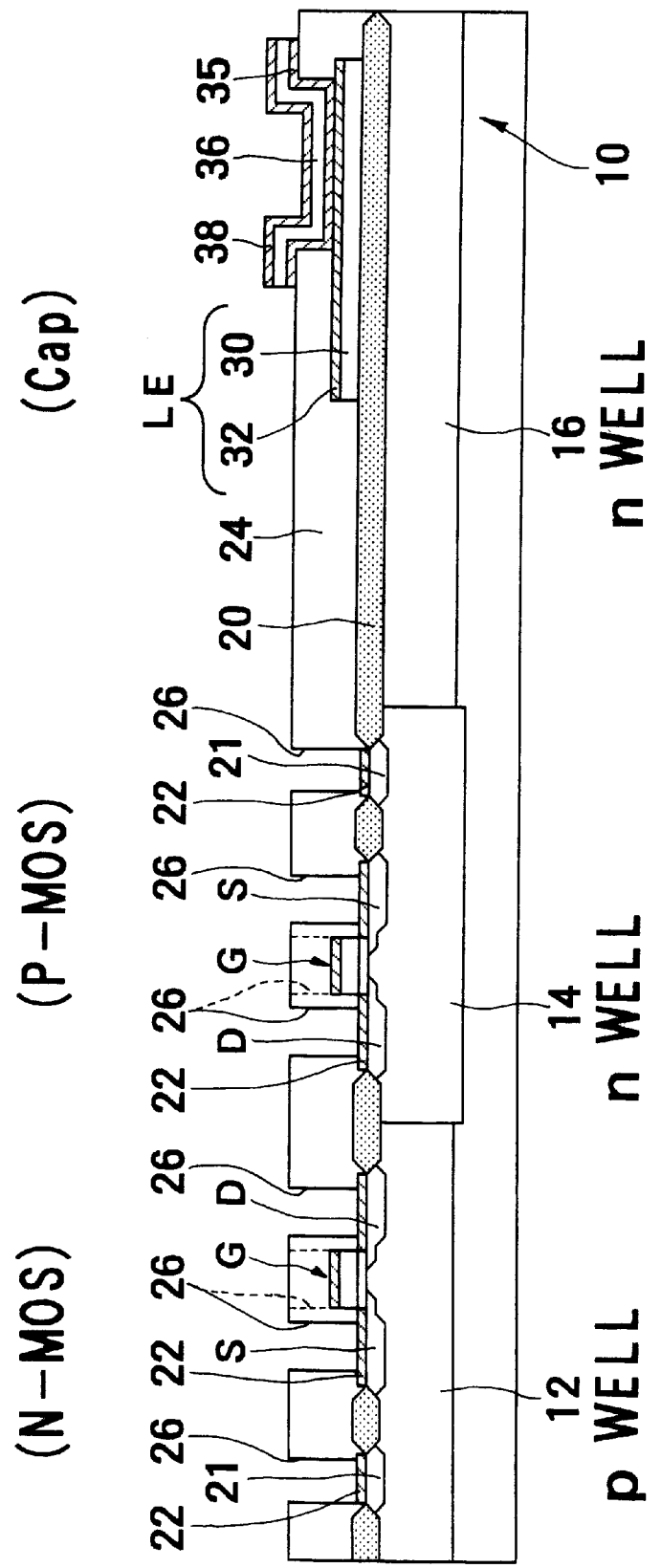

The feature of this first embodiment is to protect a capacitor dielectric film 35 by use of a $TiSi_2$ layer 38 (i.e., a high melting point silicide film), when an intermediate semiconductor device as shown in FIG. 6 is cleaned by applying a voltage to a silicon substrate 10.

Figure 1:
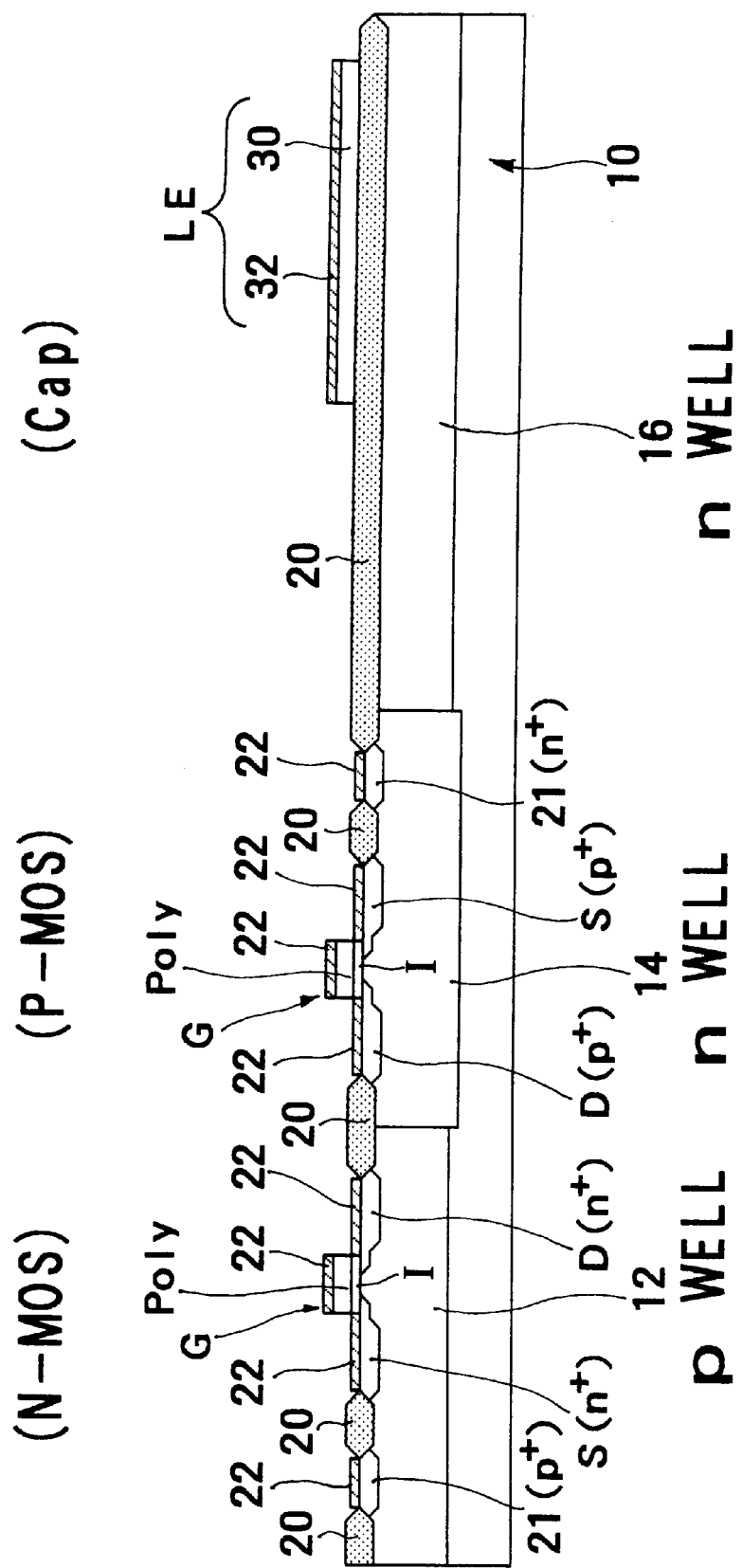
FIGS. 1 to 7 are cross-sectional views each for assistance in explaining a part of the process of manufacturing a first embodiment of the semiconductor device according to the present invention.

First, as shown i FIG. 1, a p-well 12, an n-well 14 and an n-well 16 are formed on the surface of a silicon substrate 10. Further, a plurality of element separating regions 20 are formed on the same surface of the substrate 10. On the left side in FIG. 1, an N-MOS transistor and a P-MOS transistor are formed at a portion sandwiched between the two element separating regions 20, respectively. Further, on the right side of FIG. 1, a capacitor Cap is formed on the element separating region 20 formed on the n-well 16. Here, since the structure of both the N-MOS transistor and the P-MOS transistor is roughly the same with respect to each other, except the sort of its impurity type, only the N-MOS transistor will be mainly explained hereinbelow.

In the N-MOS transistor 12, an ohmic contact region 21, a source diffusion layer S, and a drain diffusion layer D are formed between the two element separating regions 20, respectively. This ohmic contact region 21 is formed to apply a voltage to the p-well 12. Further, a gate insulating film I is formed on a channel formed between the source diffusion layer S and the drain diffusion layer D. Further, a poly silicon Poly is formed on this gate insulating film I as a part of the gate electrode G. Here, impurities such as boron or phosphorous are doped to this poly silicon Poly. This gate electrode G is formed as a two-layer structure of the poly silicon Poly and a silicide film 22 (described later). The same process as explained above can be applied to the P-MOS transistor.

When the poly silicon Poly of the gate electrode G is formed, a poly silicon layer 30 is necessarily formed as the same layer, as shown on the right side in the same drawing. In other words, the lower electrode LE of the capacitor is formed as a two-layer structure of the poly silicon layer 30 and the silicide film 32 (described later). Here, impurities such as boron or phosphorous are doped to this poly silicon 30.

Further, a high melting point metal film formed of Co (Cobalt) is formed on the ohmic contact region 21, the source diffusion region S, the drain diffusion region D, the poly silicon Poly, and the poly silicon layer 30. After that, silicide film pieces 22 and 32 formed of $CoSi_2$ are selectively formed through a silicide process for performing selective etching on the basis of reaction between the high melting point metal film and the poly silicon layer, respectively. Here, as the high melting point metal film, it is possible to use Ti, Mo, W, Ni, etc. in addition to Co. In this case, $TiSi_2$, $MoSi_2$, WSi, NiSi, etc. are formed as the silicide film pieces 22 and 32, respectively. The above-mentioned process has been well known, so that more detailed description thereof is omitted herein.

Figure 2:
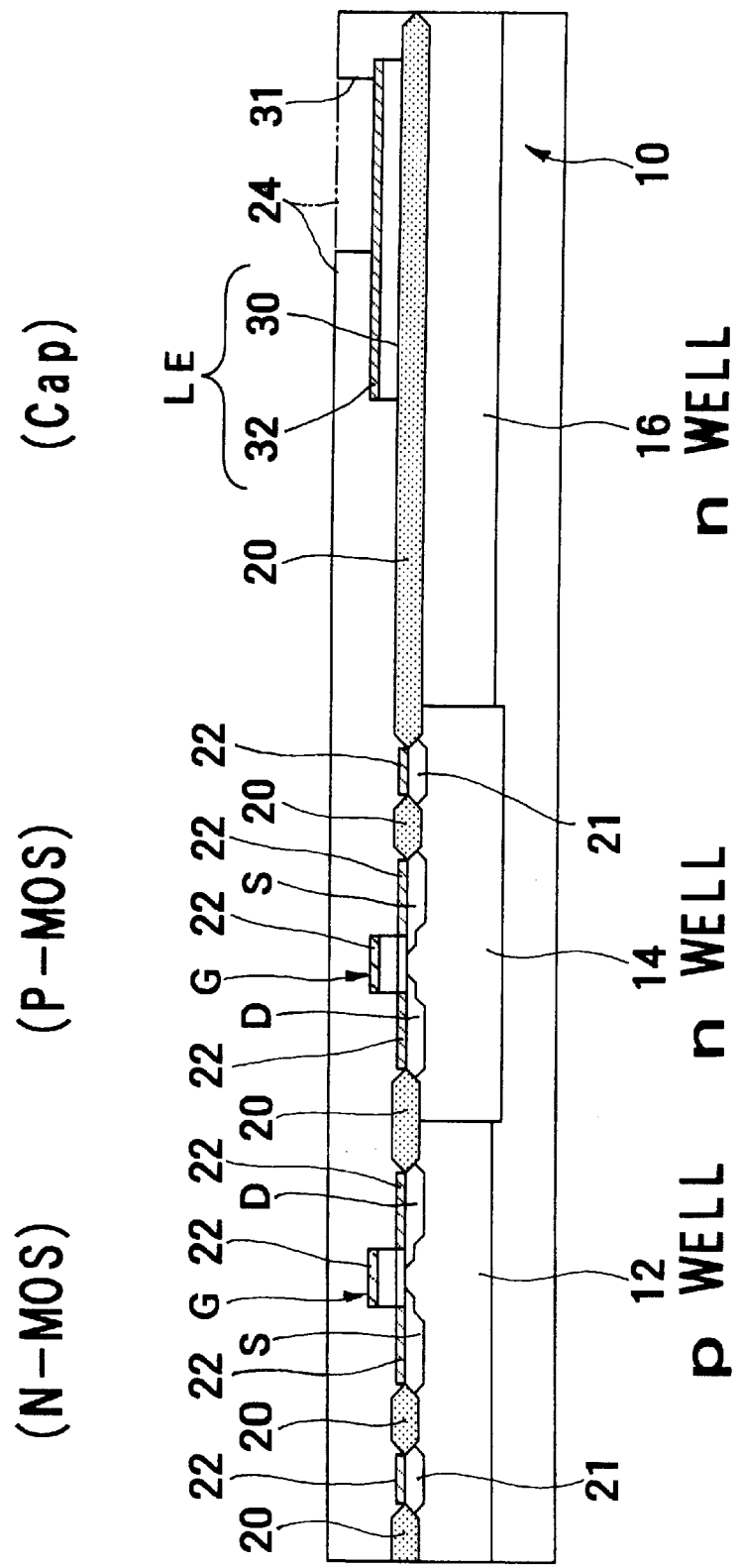

Further, as shown in FIG. 2, a $SiO_2$ film 24 is formed all over the surface of this intermediate semiconductor device by the low pressure CVD (chemical vapor deposition) method. Further, the formed $SiO_2$ film 24 is etched by the photo-lithography and RIE (reactive ion etching) to form a hole 31. By this process, it is possible to expose the silicide film 32 at a region in which the capacitor Cap is to be formed. In accordance with the above-mentioned process, an intermediate semiconductor device as shown in FIG. 2 can be obtained.

Figure 3:
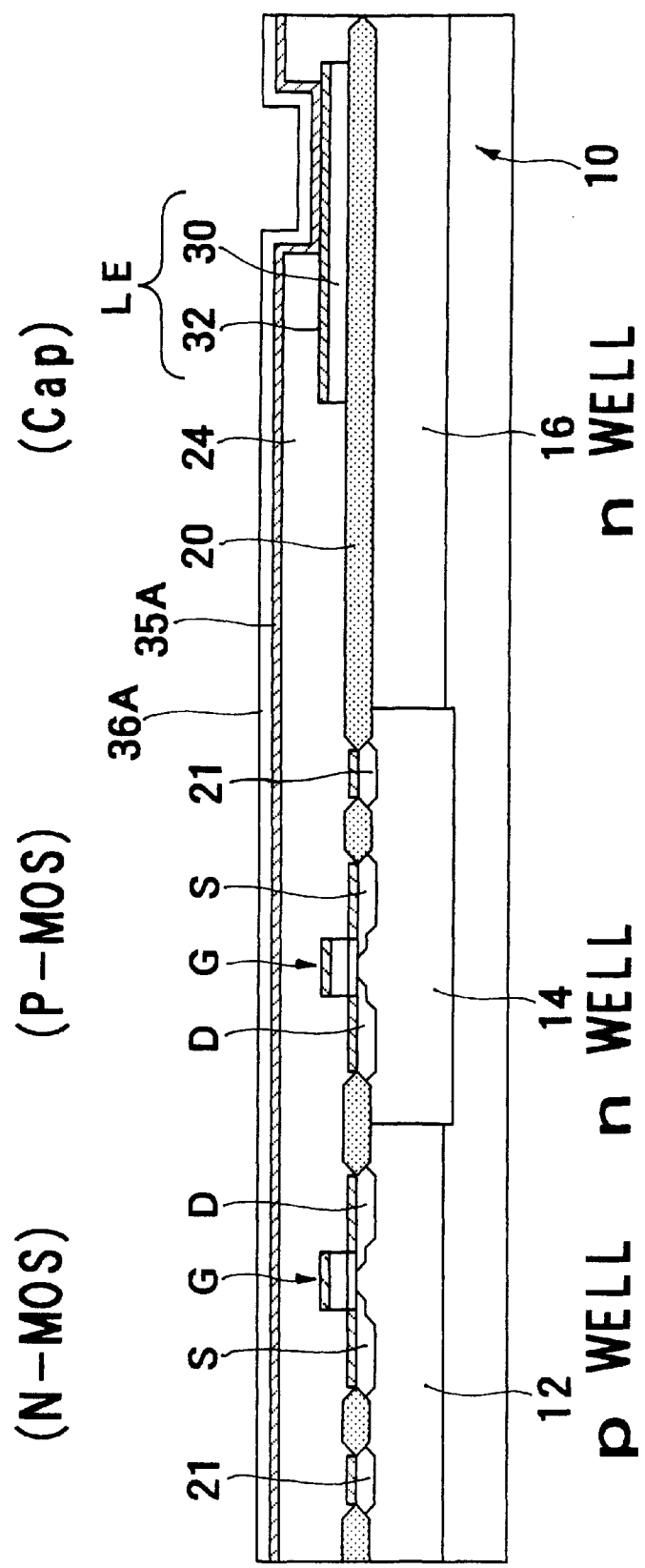

Further, as understood by FIG. 3, a $Si_3N_4$ layer 35A is formed all over the surface of the semiconductor device, that is, all over the $SiO_2$ film 24 and the silicide film 32 by the LPCVD (low pressure CVD) method. In addition, a poly silicon layer 36A doped with impurities such as boron and phosphorous is formed all over the $Si_3N_4$ layer 35A by the same LPCVD method. On the basis of the above-mentioned process, it is possible to obtain the intermediate semiconductor device as shown in FIG. 3.

Figure 4:
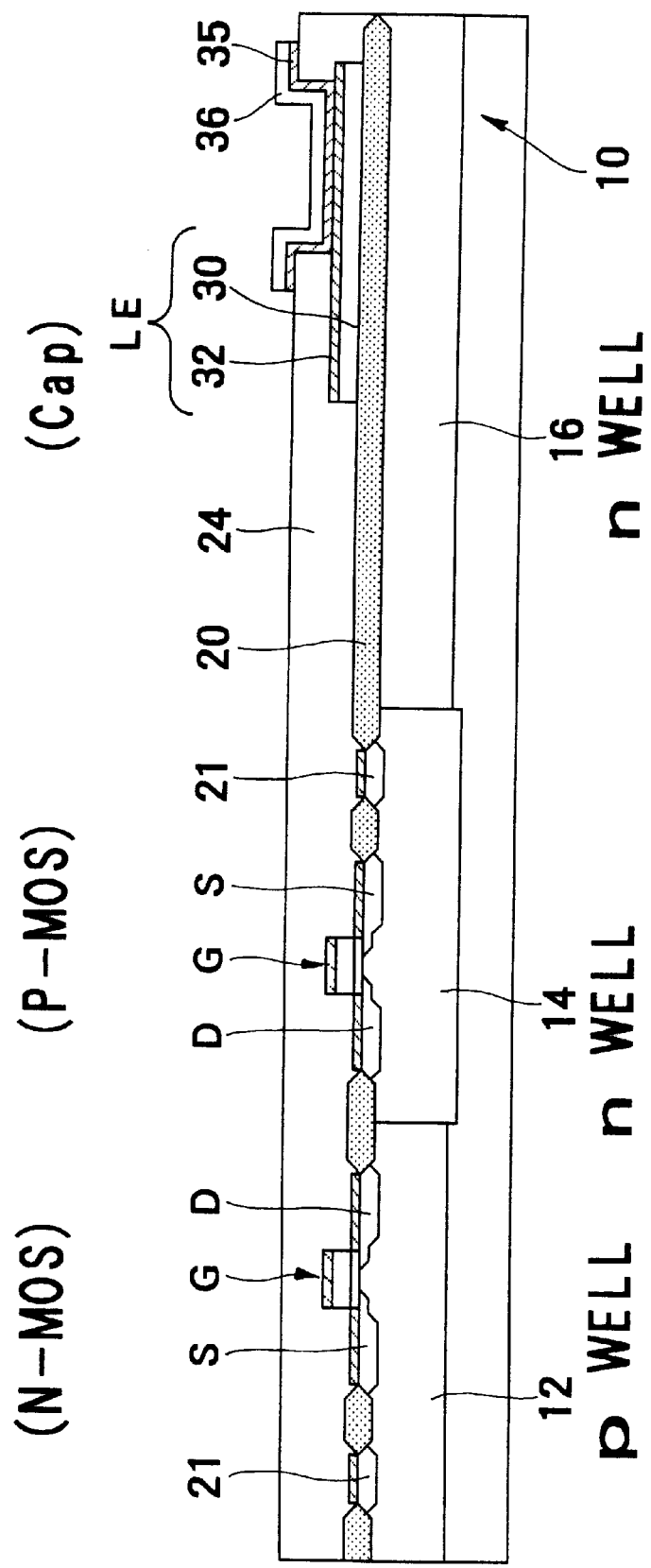

Further, as understood by FIG. 4, the $Si_3N_4$ layer 35A and the poly silicon layer 36A are both removed by the photo-lithography and RIE, except the region at which the capacitor Cap is to be formed, to leave the same layers as the capacitor dielectric film 35 and the poly silicon layer 36, respectively. On the basis of the above-mentioned process, it is possible to obtain an intermediate semiconductor device as shown in FIG. 4.

Figure 5:
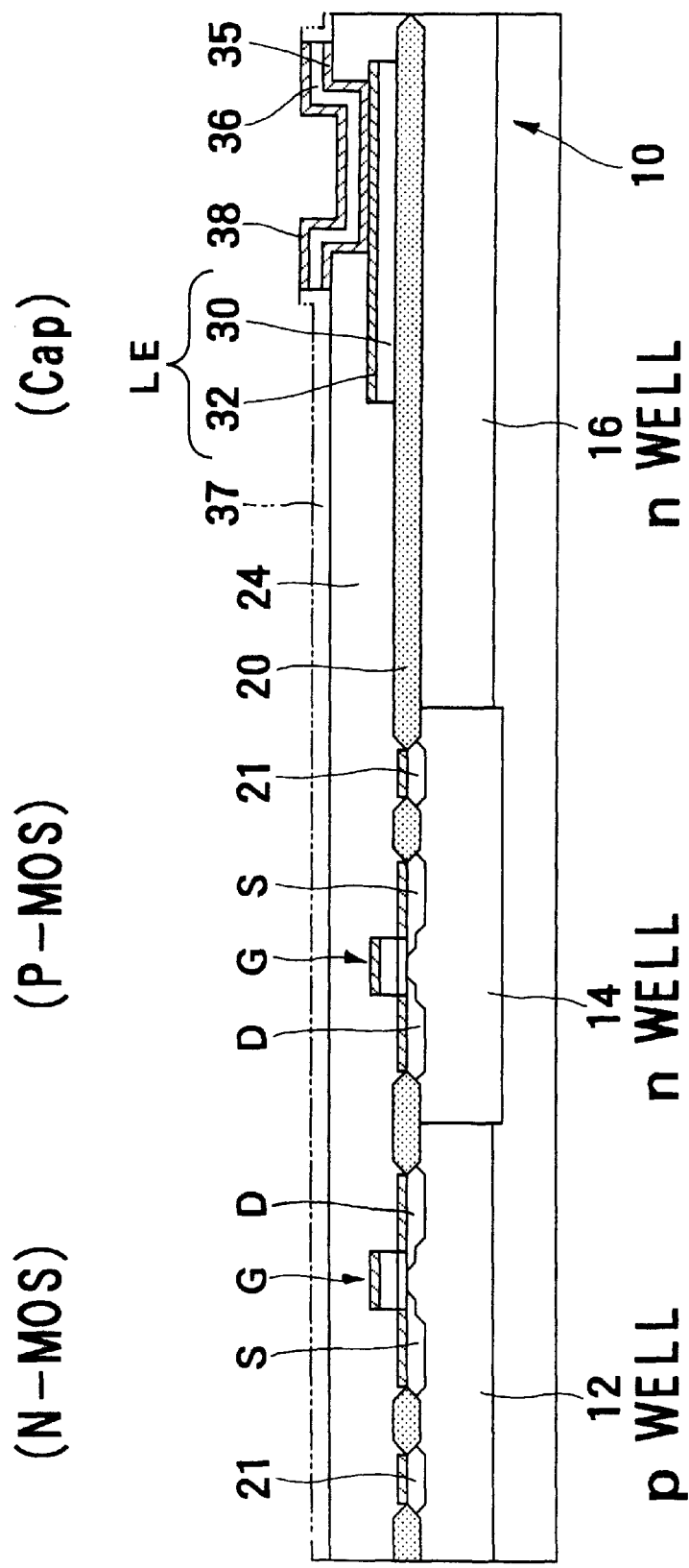

Further, as understood by FIG. 5, a Ti and TiN layer 37 is formed all over the $SiO_2$ film 24 and the poly silicon film 36 by spattering. This formed Ti and TiN layer 37 is allowed to react upon the poly silicon layer 36 by RTA (rapid thermal annealing) method, and further the non-reaction Ti and TiN layer 37 is etched by sulfuric acid and peroxide based processing (processing by use of $H_2SO_4$ and $H_2O_2$). By this process, it is possible to selectively form the $TiSi_2$ layer 38 of high melting point silicide film on the poly silicon layer 36. On the basis of the above-mentioned process, it is possible to obtain an intermediate semiconductor device as shown in FIG. 5.

Further, as understood by FIG. 6, the $SiO_2$ film 24 is etched by the photo-lithography and RIE, to form some contact holes 26, so that it is possible to expose the silicide film pieces 22 from these formed contact holes 26. In this process, since it is necessary to remove a resist used for the photo-lithography, this resist is usually removed by the sulfuric acid and peroxide based processing. In this case, however, the $TiSi_2$ layer 38 for covering the capacitor dielectric film 35 cannot be etched by the above-mentioned sulfuric acid and peroxide processing. In other words, it is preferable to select substance not etched by the sulfuric acid and peroxide processing, as a conductive protection film for covering the capacitor dielectric film 35. On the basis of the above-mentioned process, it is possible to obtain an intermediate semiconductor device as shown in FIG. 6. Further, although a hole reaching the gate electrode G has been formed, this gate electrode G is formed at a position not seen by the cross-sectional view shown in FIG. 6.

Further, as understood by FIG. 7, in order to reduce the contact resistance between the electrode wire 44 (described later) and each of the gate electrode G, the source diffusion layer S and the drain diffusion layer D, respectively, all over the surface of the intermediate semiconductor device is cleaned, as pre-process of forming a barrier metal layer 40 and a wiring layer 42. In more detail, a reverse spattering processing is performed by etching the uppermost surface of the semiconductor device, while applying a voltage to the silicon substrate 10. After that, the barrier metal layer 40 formed of TiN is formed all over the surface of this intermediate semiconductor device by spattering. Successively, in the same way as above, the wiring layer 42 formed of Al is formed all over the surface of this barrier metal layer 40 by spattering. By this process, it is possible to obtain an intermediate semiconductor device as shown in FIG. 7.

Figure 8:
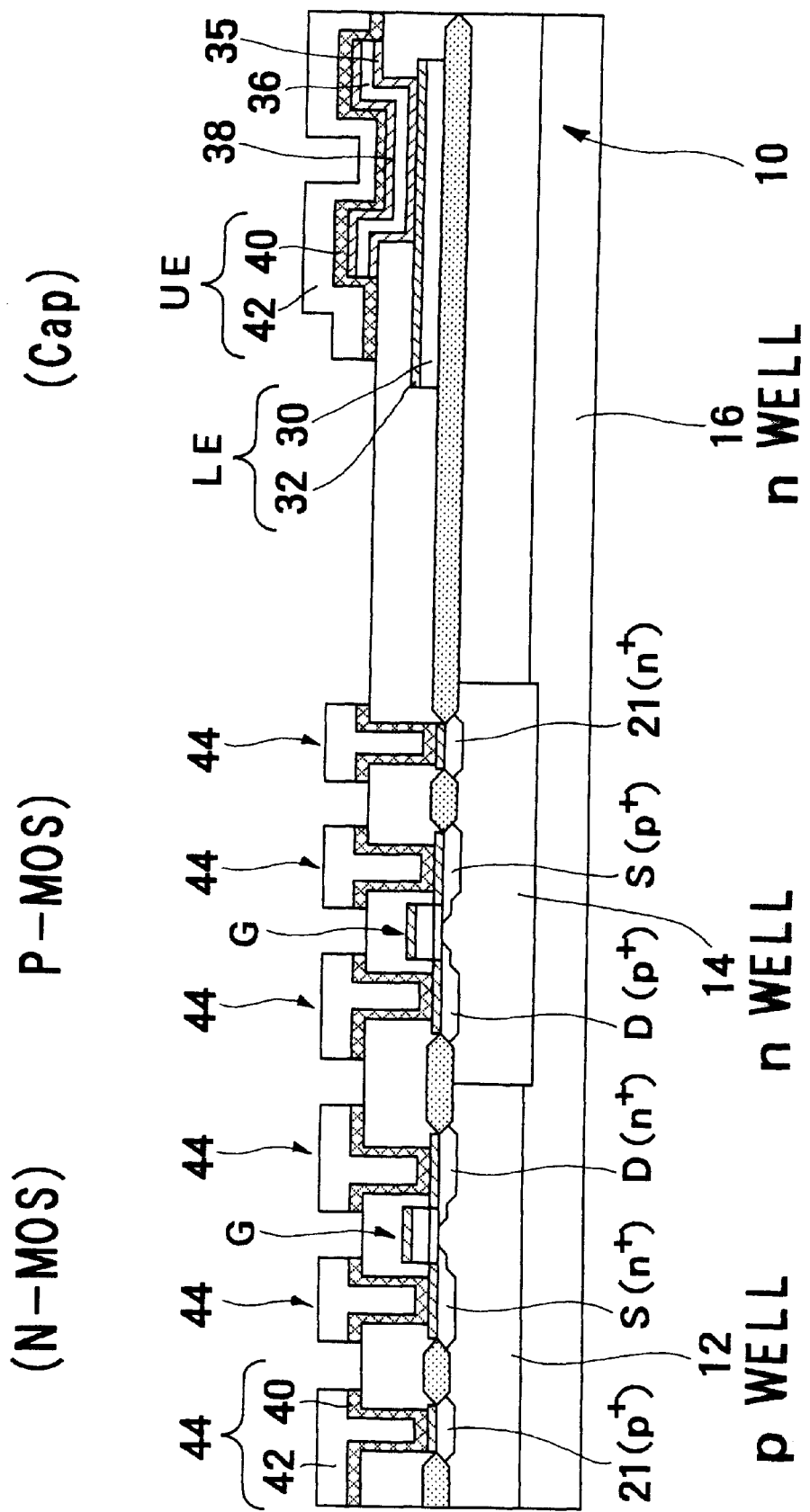
FIG. 8 is a cross-section view showing the first embodiment of the semiconductor device according to the present invention.

Further, as understood by FIG. 8, the barrier metal layer 40 and the wiring layer 42 are both patterned or etched by the photo-lithography and RIE, to form electrode wires 44 of the MOS transistors formed on the left side in FIG. 8 and the upper electrode UE of the capacitor Cap formed on the right side in the same drawing. On the basis of the above-mentioned process, it is possible to obtain an intermediate semiconductor device as shown in FIG. 8. In the semiconductor device shown in FIG. 8, although the semiconductor device according to the present invention is completed, after that, the other wiring layers can be further formed one upon another where necessary.

Figure 7:
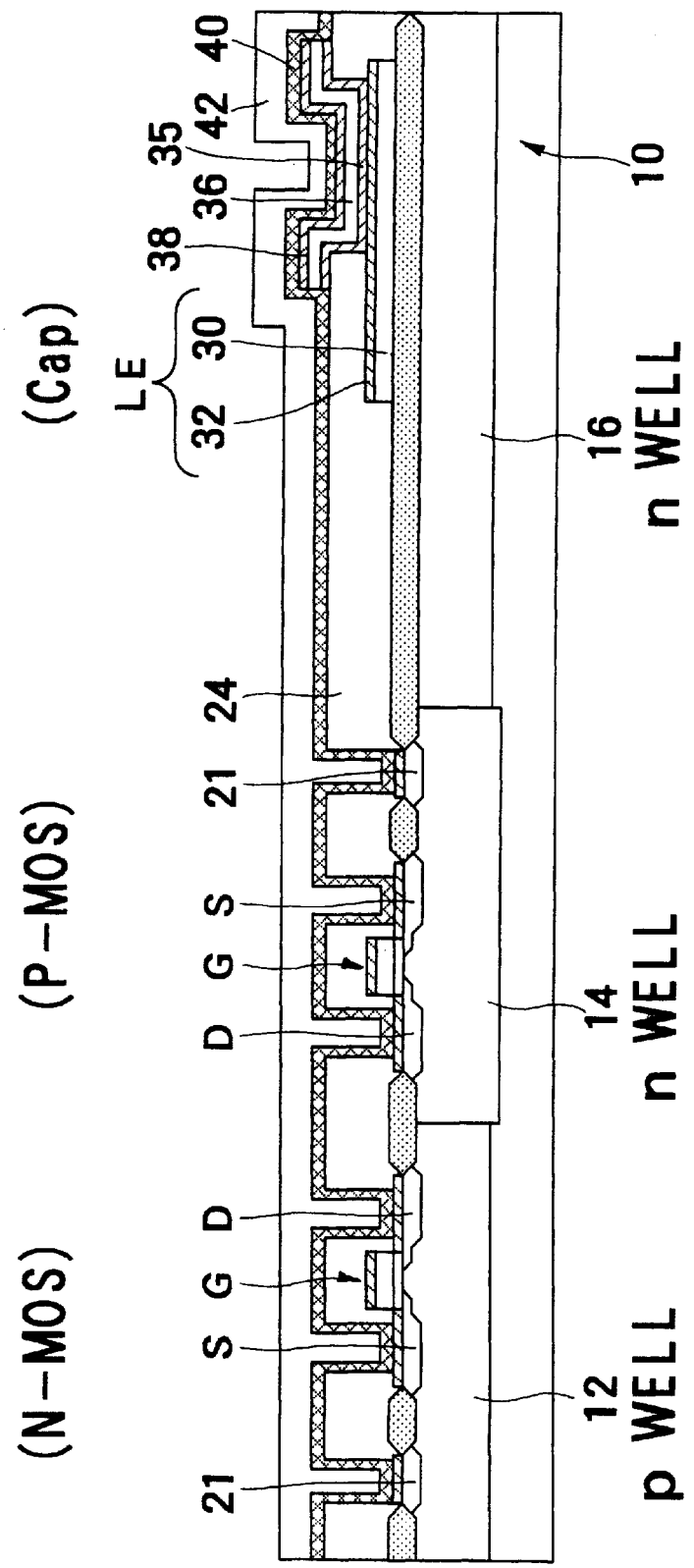

As described above, in the first embodiment of the semiconductor device, as understood by FIG. 6, after the contact holes 26 with the ohmic contact region 21, the source diffusion layer S, the drain diffusion layer D, and the gate electrode G have been all formed, all over the surface of the intermediate semiconductor device is cleaned, as the pre-process of forming the barrier metal layer 40 and the wiring layer 42 both shown in FIG. 7. In this case, as understood by FIG. 6, the capacitor dielectric film 35 is protected by the $TiSi_2$ layer 38 of high melting point silicide film. Therefore, owing to the presence of this $TiSi_2$ film 38, it is possible to prevent the capacitor dielectric film 35 from being damaged when a voltage is applied to the substrate, with the result that the long-term reliability of the capacitor Cap can be improved. In other words, it is possible to solve such a problem that the surface of the capacitor dielectric film 35 is damaged during the etching process and thereby the space between the lower electrode LE and the upper electrode UE of the capacitor changes partially. As a result, the capacitance and the breakdown voltage of the capacitor can be both uniformalized.

(2nd Embodiment)

A second embodiment of the semiconductor device according to the present invention will be described hereinbelow with reference to FIGS. 9 to 14.

Figure 14:
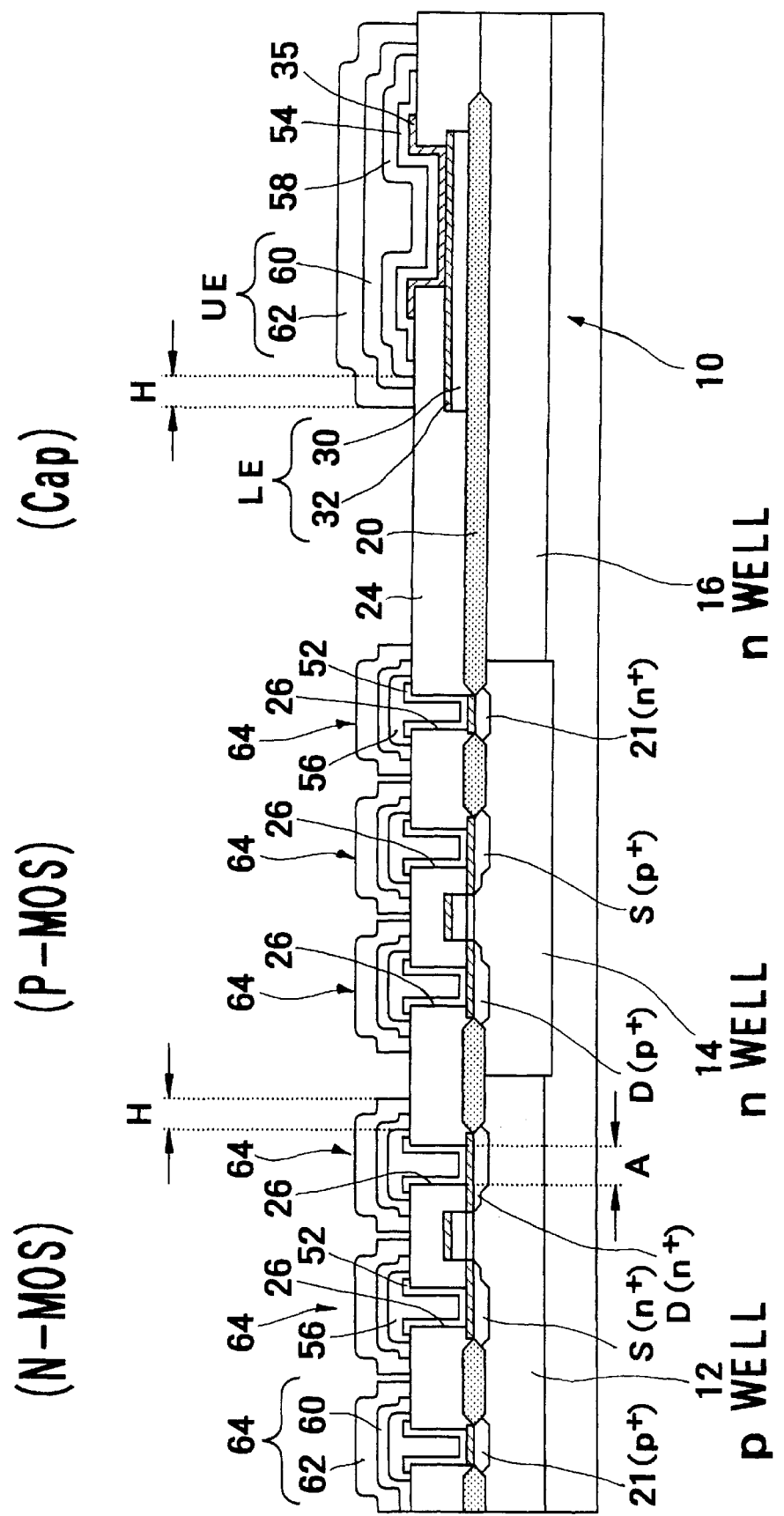
FIG. 14 is a cross-section view showing the second embodiment of the semiconductor device according to the present invention.

The feature of this second embodiment is to further improve the feature of the first embodiment, that is, to form the contact material buried in the contact holes 26 of the MOS transistors by use of a poly silicon layer 52 and further to reduce the hole width A of each hole 26, as shown in FIG. 14.

Figure 9:
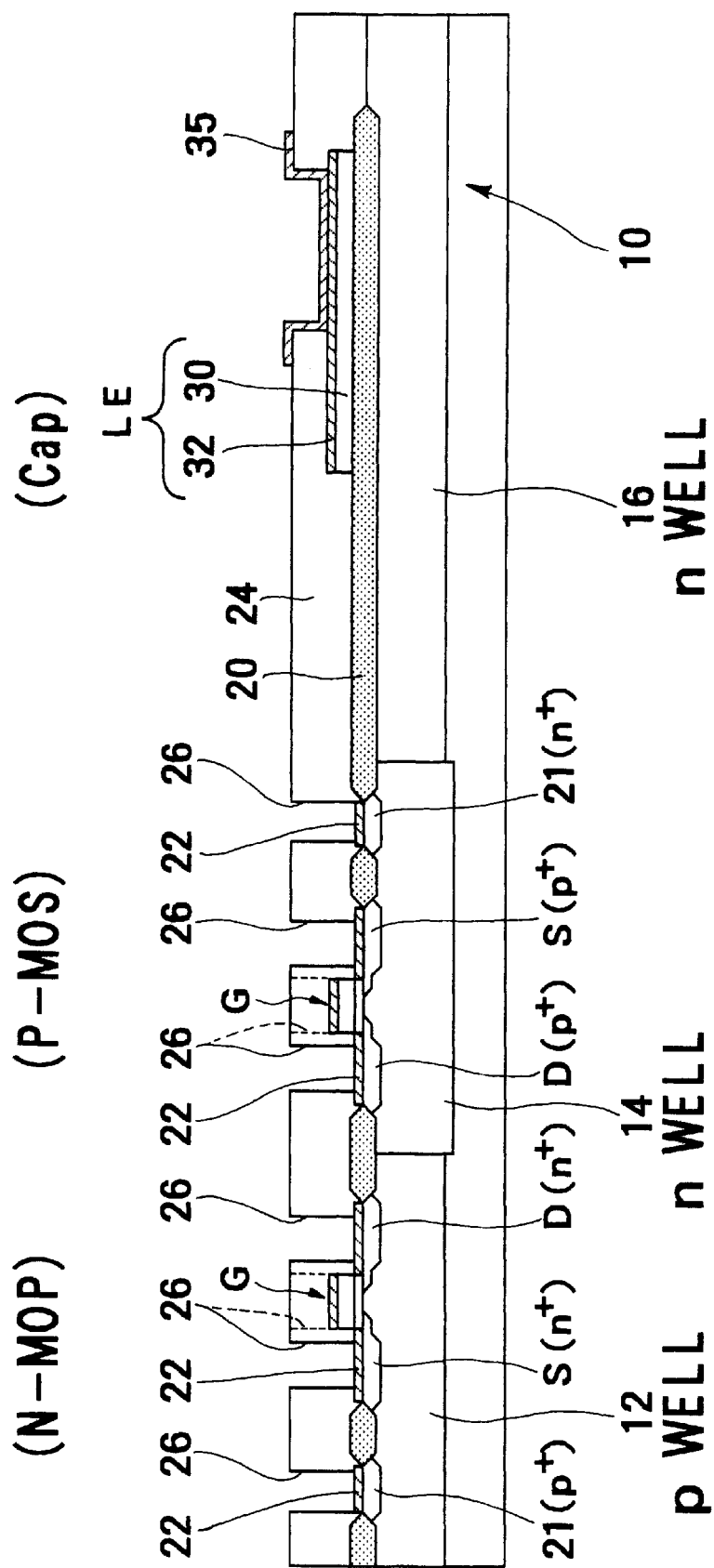
FIGS. 9 to 13 are cross-sectional views each for assistance in explaining a part of the process of manufacturing a second embodiment of the semiconductor device according to the present invention.
Figure 20:
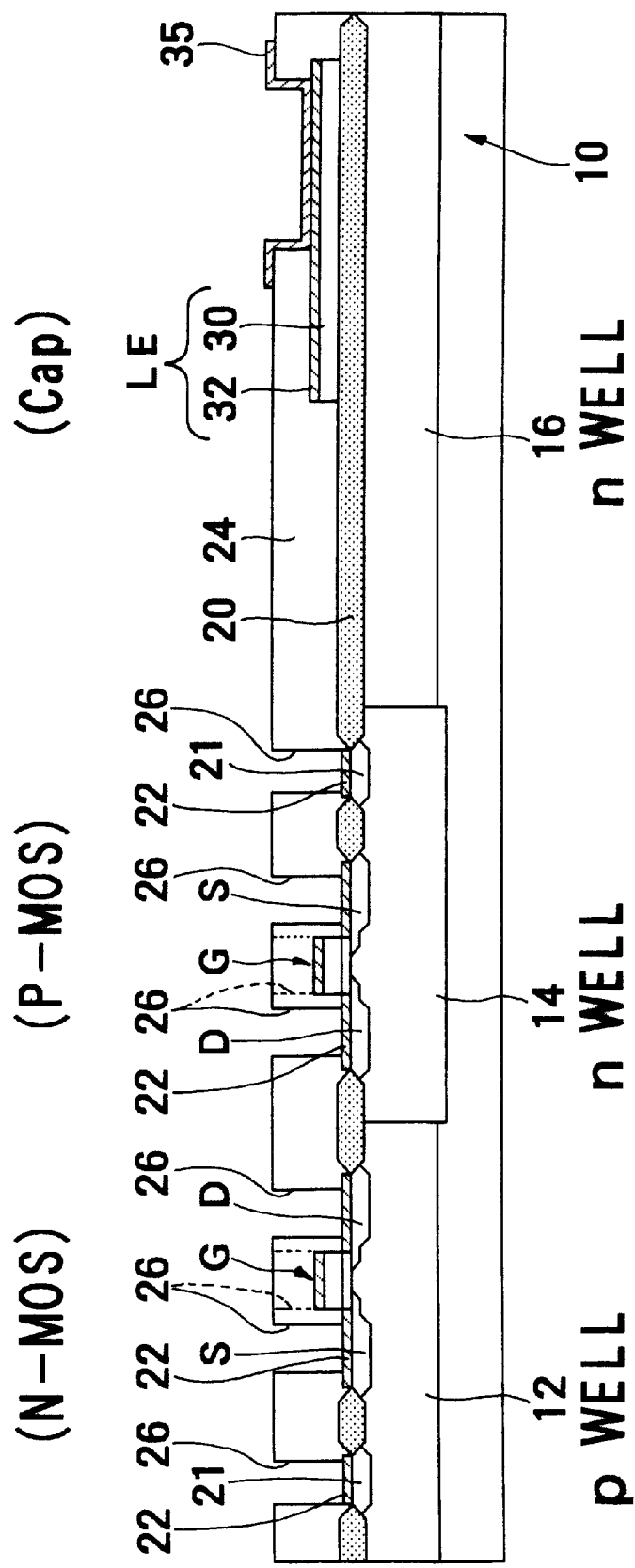
Figure 21:
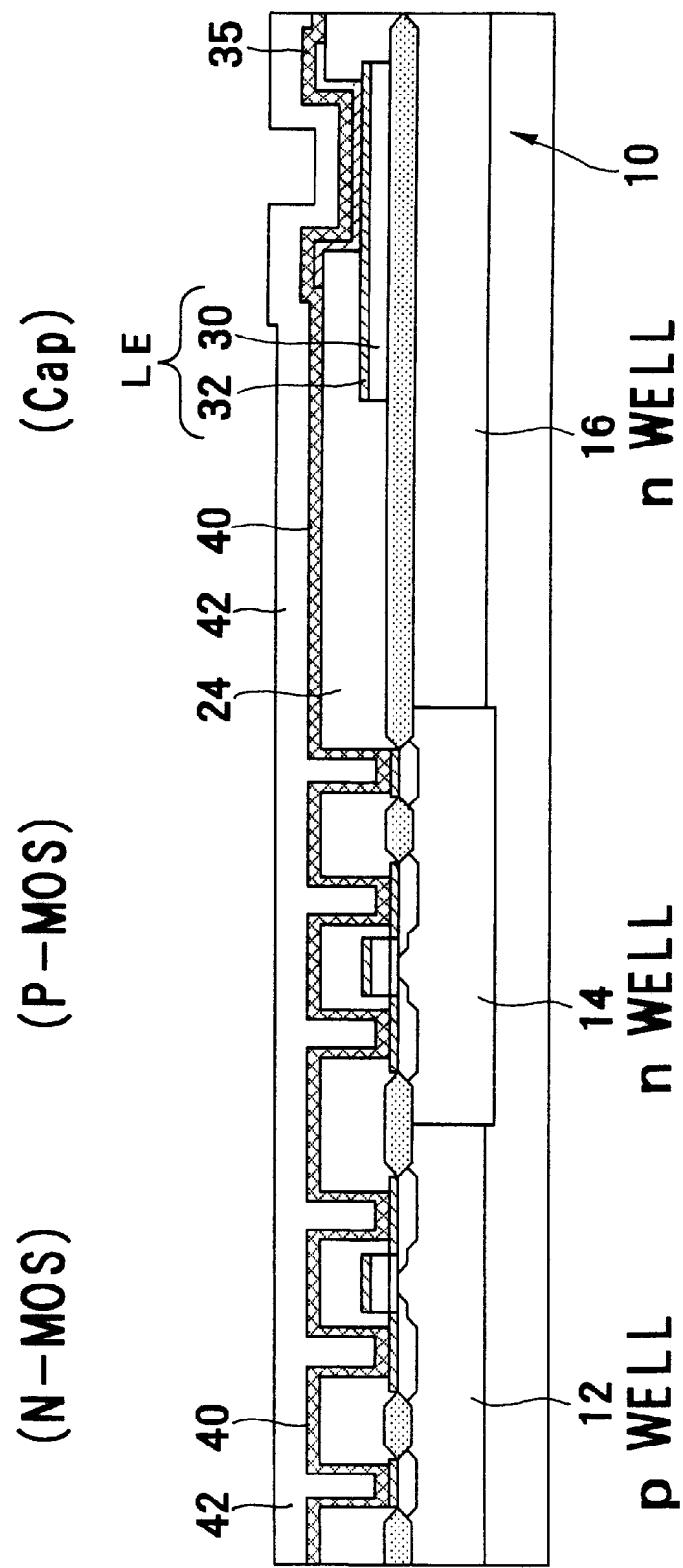
Figure 22:
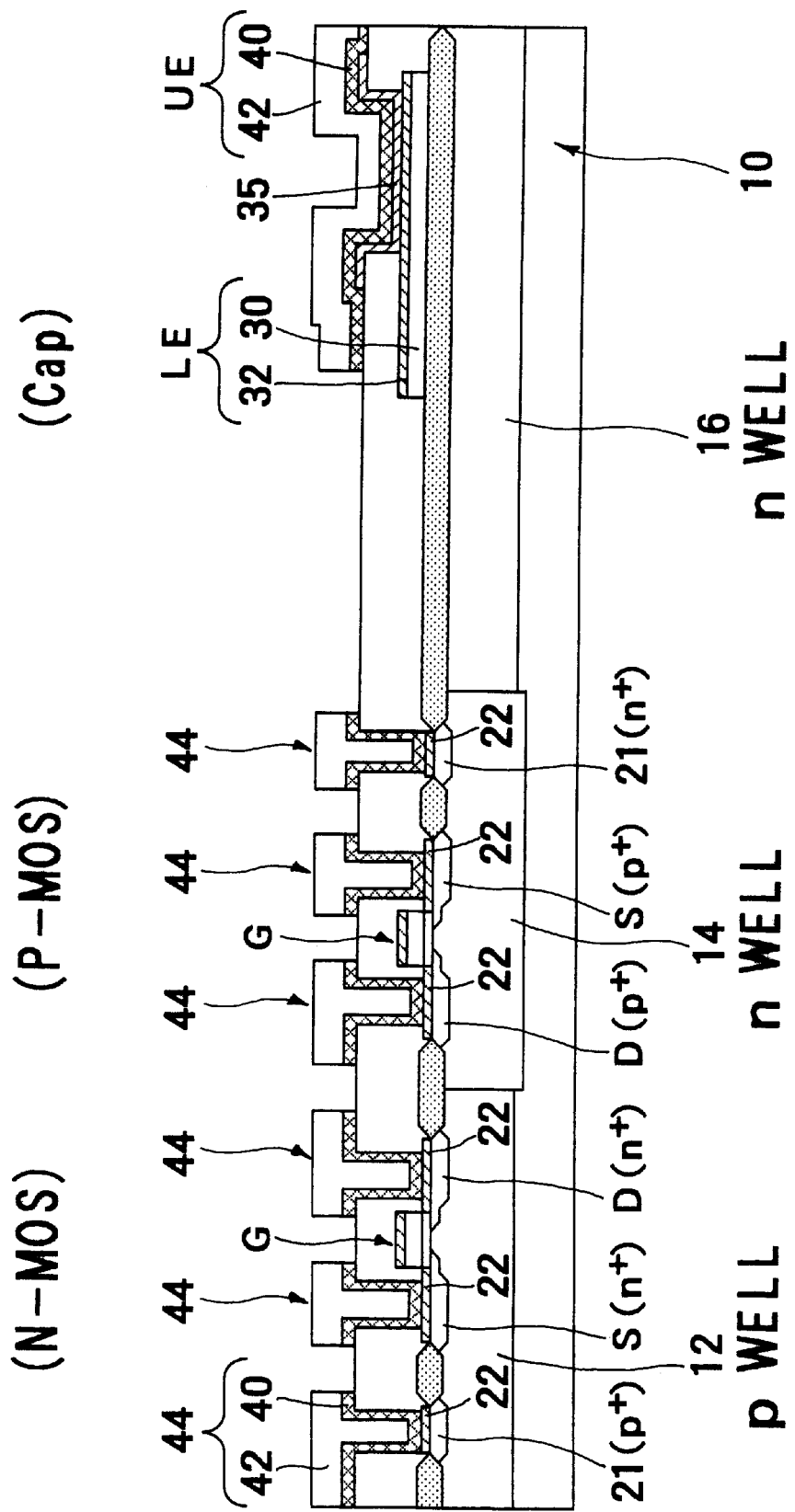
FIG. 22 is a cross-section view showing the prior art semiconductor device.

FIG. 9 is a cross-sectional view showing the intermediate semiconductor device which is substantially the same as the prior art intermediate semiconductor device shown in FIG. 20. Further, the manufacturing process for obtaining the intermediate semiconductor device shown in FIG. 9 is the same as that of the first embodiment, so that the similar description thereof is omitted herein.

Figure 10:
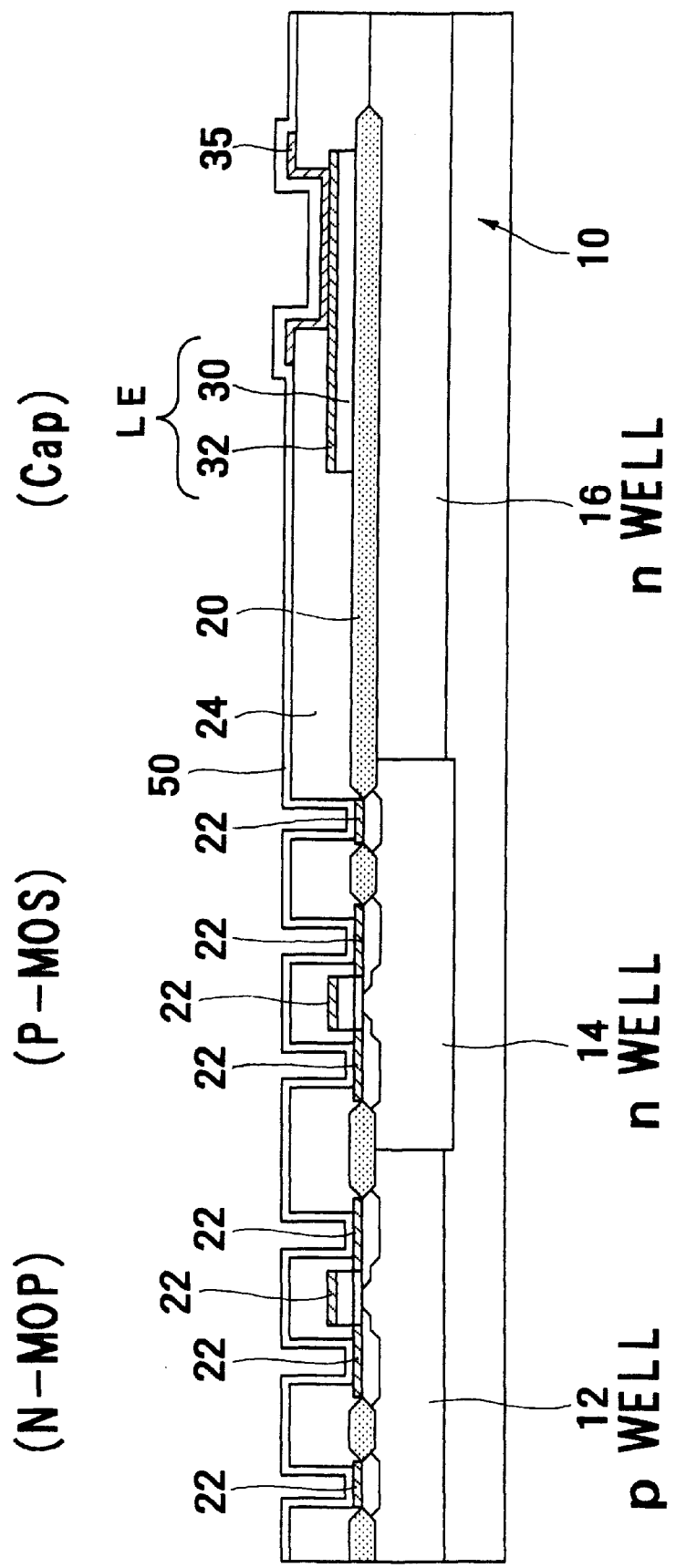

As understood by FIG. 10, a poly silicon layer 50 doped with impurities such as boron or phosphorous is formed all over the surface of this intermediate semiconductor device shown in FIG. 9 by the LPCVD method. By this process, it is possible to obtain an intermediate semiconductor device as shown in FIG. 10.

Figure 11:
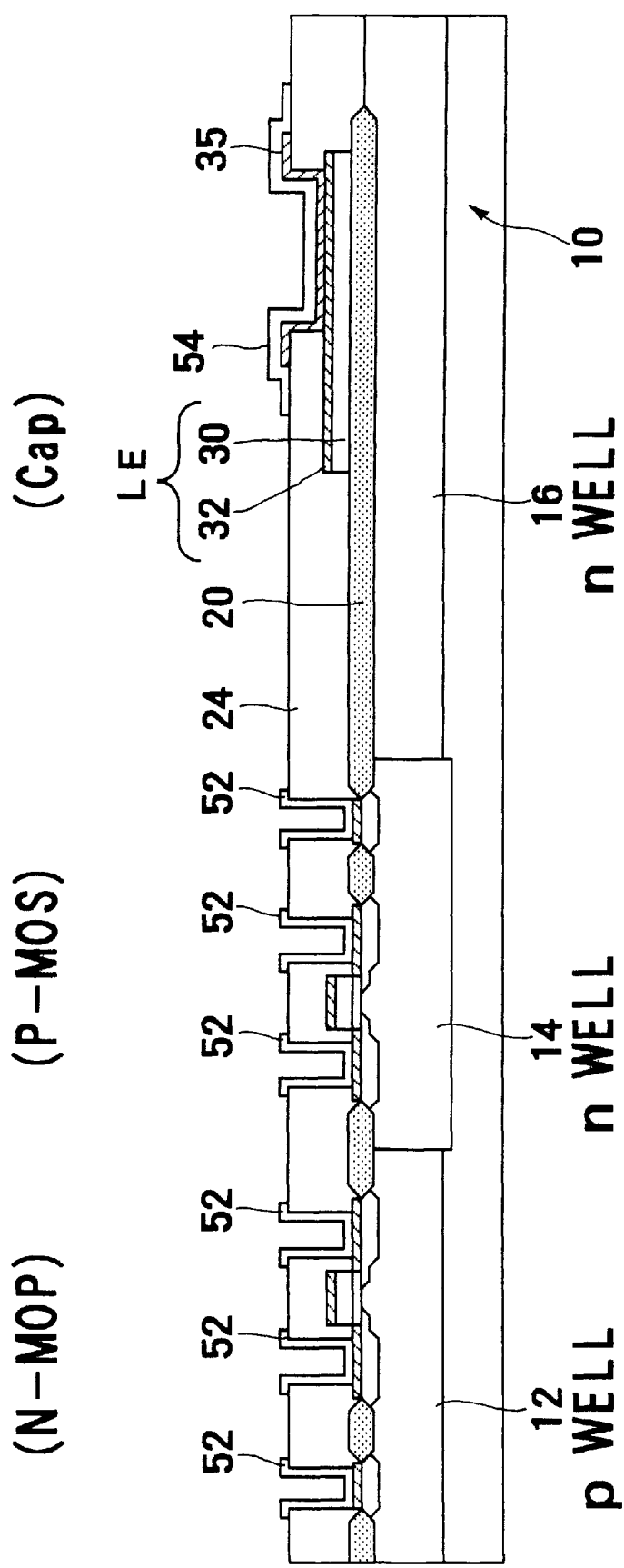

Further, as understood by FIG. 11, a part of the poly silicon layer 50 is etched into a predetermined pattern by the photo-lithography and RIE. By this etching process, the poly silicon layer pieces 52 for the MOS transistors formed on the left side in FIG. 11 and the poly silicon layer piece 54 for the capacitor Cap formed on the right side in the same drawing can be formed. On the basis of the above-mentioned process, it is possible to obtain the intermediate semiconductor device as shown in FIG. 11.

Figure 12:
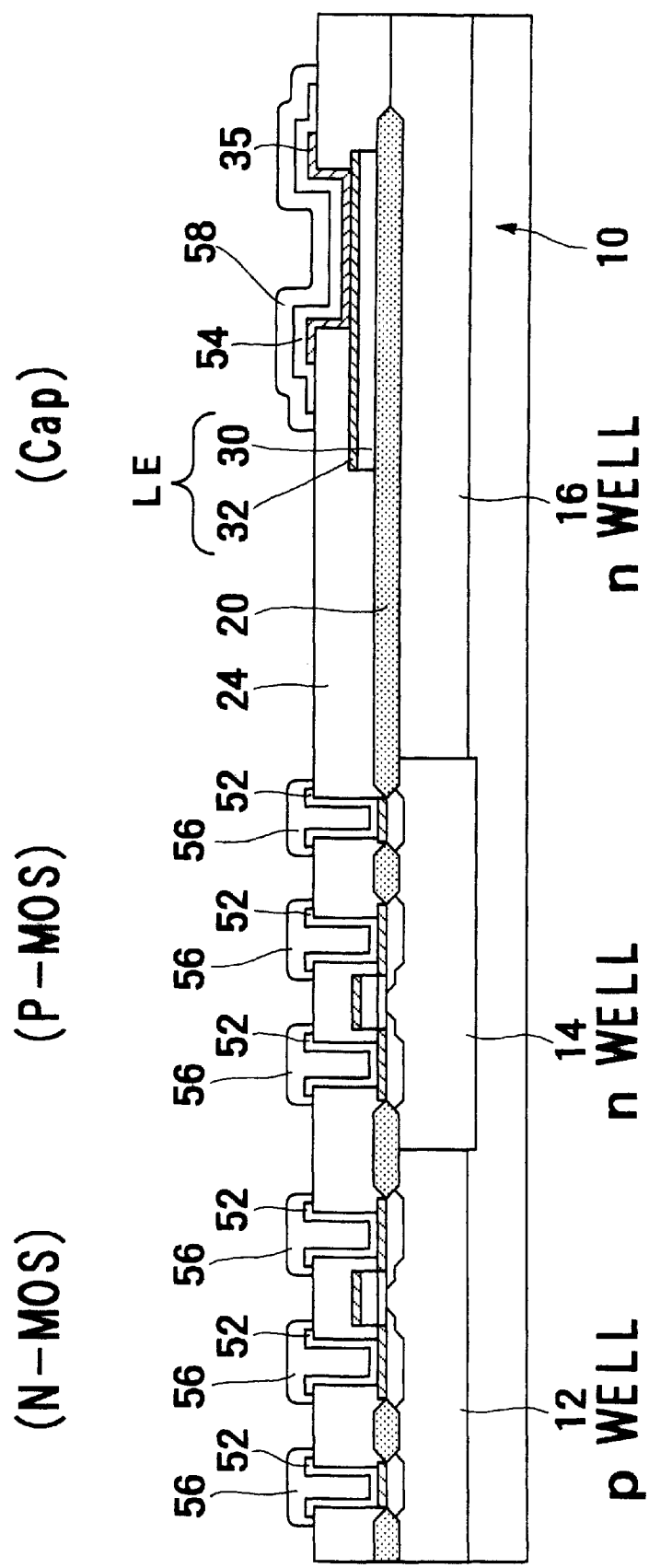

Further, as understood by FIG. 12, a Ti and TiN layer is formed all over the surface of the semiconductor device by spattering. Successively, this formed Ti and TiN layer is allowed to react upon the poly silicon layer pieces 52 and 54 by the RTA (rapid thermal annealing) method. After that, the non-reaction Ti and TiN layer is etched by sulfuric acid and peroxide based processing, to selectively form the $TiSi_2$ layer pieces 56 for MOS transistors on the left side in FIG. 11 and a $TiSi_2$ layer piece 58 for the capacitor Cap on the right side in the same drawing. On the basis of the above-mentioned process, it is possible to obtain an intermediate semiconductor device as shown in FIG. 12.

Figure 13:
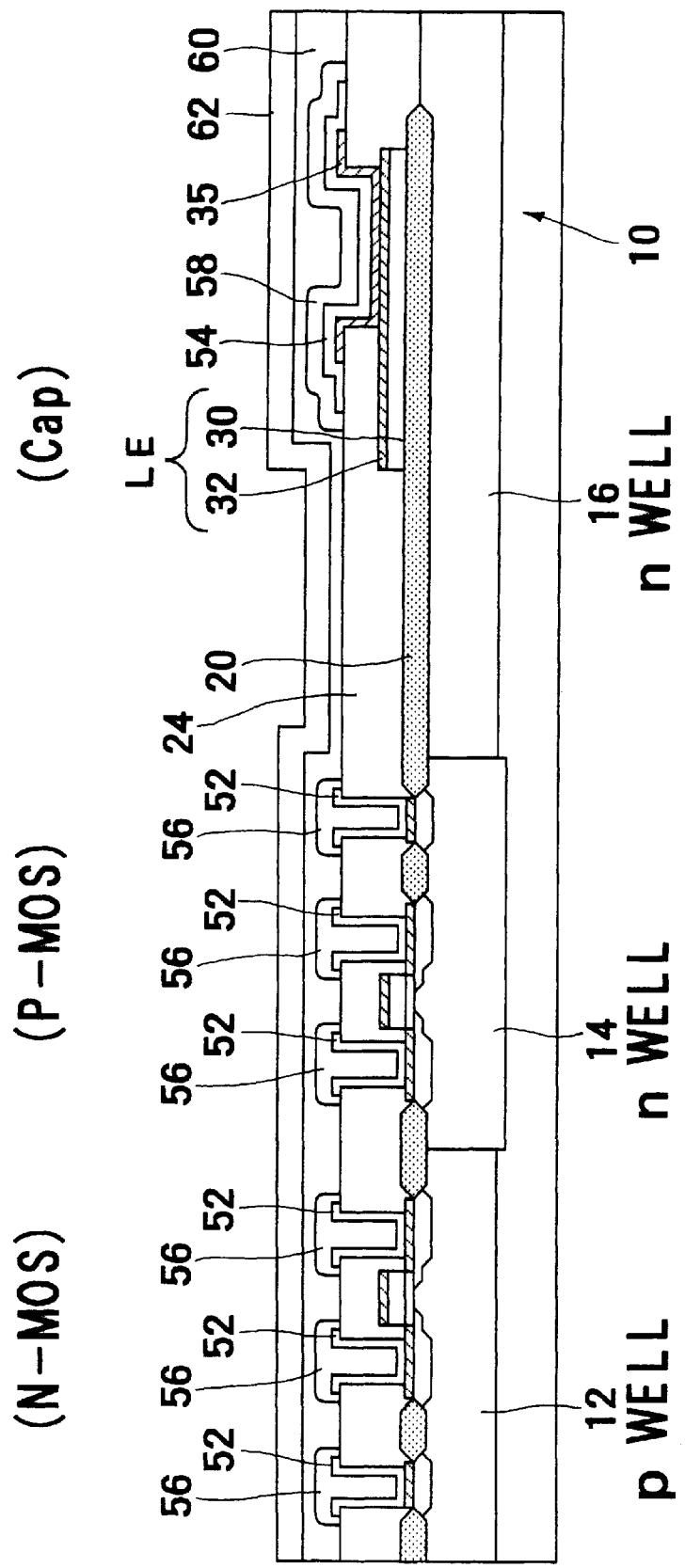

Further, as understood by FIG. 13, in order to reduce the contact resistance between the electrode wire 64 (described later) and each of the $TiSi_2$ layer pieces 56, respectively, all over the surface of the intermediate semiconductor device is cleaned, as pre-process of forming a barrier metal layer 60 and a wiring layer 62. In more detail, a reverse spattering processing is performed by etching the uppermost surface of the semiconductor device while applying a voltage to the silicon substrate 10. After that, the barrier metal layer 60 formed of TiN and the wiring layer 62 formed of Al are formed all over the surface of this intermediate semiconductor device by spattering. By this process, it is possible to obtain an intermediate semiconductor device as shown in FIG. 13.

Further, as understood by FIG. 14, the barrier metal layer 60 and the wiring layer 62 are both etched on the basis of the photo-lithography and RIE, to form electrode wire pieces 64 of the MOS transistors formed on the left side in FIG. 14 and the upper electrode UE of the capacitor Cap formed on the right side in the same drawing. On the basis of the above-mentioned process, it is possible to obtain an intermediate semiconductor device as shown in FIG. 14. In the barrier metal layer pieces 60 and the wiring layer piece 62 of the semiconductor device shown in FIG. 14, a margin (or allowance) H is formed according to each of both the barrier metal layer pieces 60 and the wiring layer piece 62. The margin H is effective to prevent the $TiSi_2$ layer pieces 56 and 58 from being damaged erroneously due to mismatch caused when the barrier metal layer pieces 60 and the wiring layer pieces 62 are etched.

As described above, in the second embodiment of the semiconductor device, the uppermost surface of the intermediate semiconductor device shown in FIG. 12 is etched by applying a voltage to the substrate. In this case, however, since the capacitor dielectric film 35 is covered with both the poly silicon film 54 and the $TiSi_2$ layer 58, it is possible to prevent the capacitor dielectric film 35 from being damaged during the etching process.

In addition, as understood by FIG. 14, in this second embodiment, the poly silicon layer 52 is used as the contact material buried in each contact hole 26 of the MOS transistors. Therefore, in this embodiment, it is adequate to bury the poly silicon layer 52 in each hole 26. In other words, it is unnecessary to bury the wiring layer 42 of Al in the hole 26, being different from the first embodiment. Therefore, in this second embodiment, the hole width A of each hole 26 can be reduced. In practice, the hole width A of at least 0.8 $\mu$m is necessary to bury Al in the hole 26 in the case of the first embodiment. On the other hand, the hole width A of 0.5 $\mu$m is sufficient in the case of the second embodiment. This is because the poly silicon can easily enter a narrow space on the basis of the properties of material, in comparison with the aluminum.

(3rd Embodiment)

A third embodiment of the semiconductor device according to the present invention will be described hereinbelow with reference to FIGS. 15 to 17.

Figure 16:
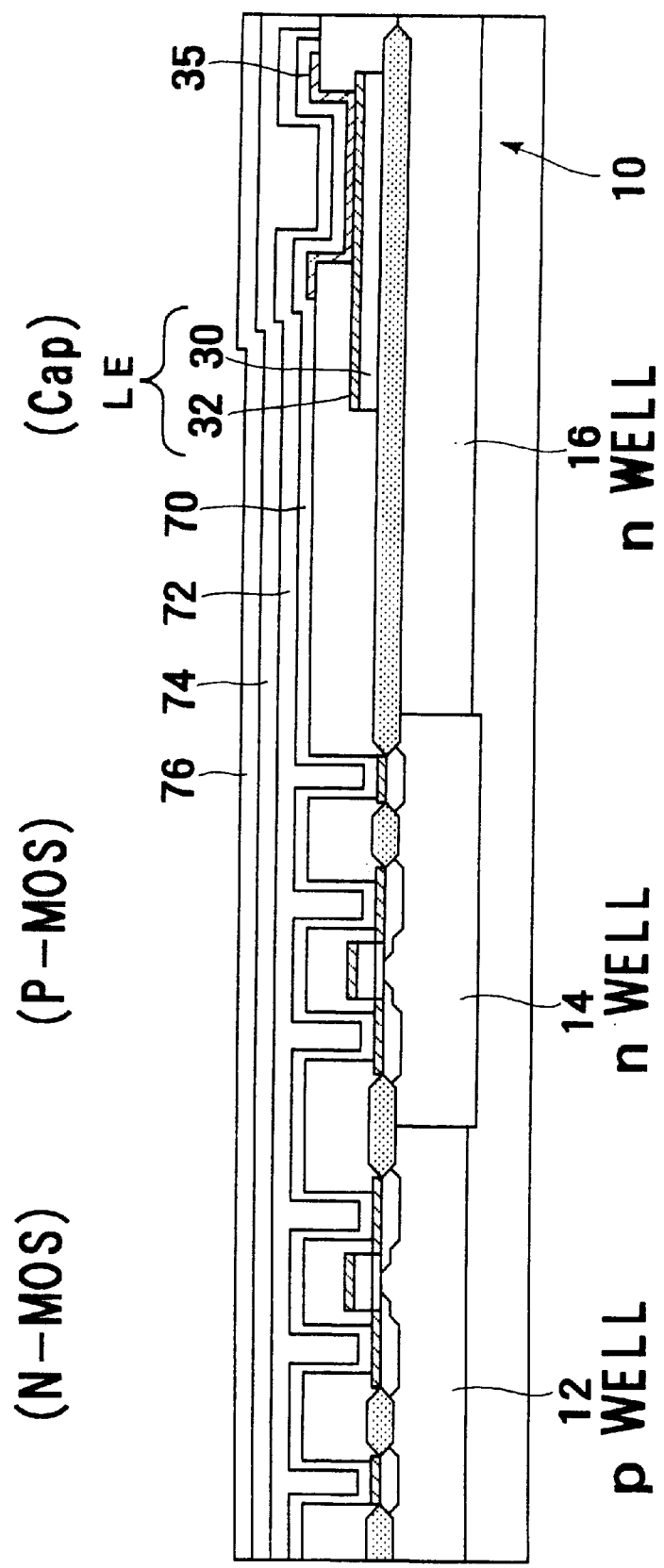

The feature of this third embodiment is to further improve the feature of the second embodiment, that is, to reduce the number of manufacturing steps by etching the poly silicon layer 70, the TiSi$_2$ layer 72, the barrier metal layer 74, and the wiring layer 76 of the intermediate semiconductor device shown in FIG. 16 by a single photolithography and a single RIE.

Figure 15:
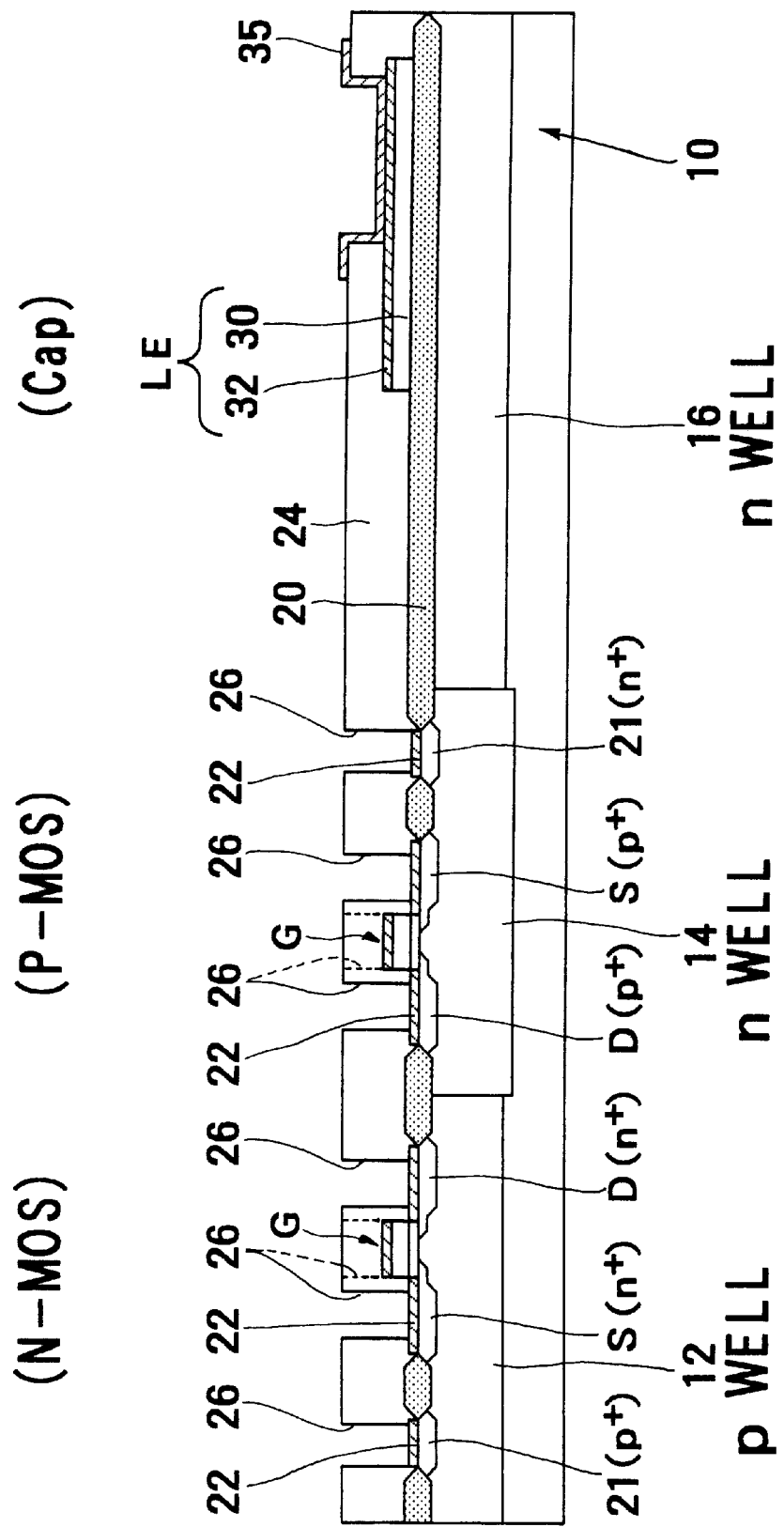
FIGS. 15 and 16 are cross-sectional views each for assistance in explaining a part of the process of manufacturing a third embodiment of the semiconductor device according to the present invention.

FIG. 15 is a cross-sectional view showing the intermediate semiconductor device which is substantially the same as the prior art intermediate semiconductor device shown in FIG. 20. Further, the manufacturing process for obtaining the intermediate semiconductor device shown in FIG. 15 is the same as with the case of the first embodiment, so that the similar description thereof is omitted herein.

As understood by FIG. 16, a poly silicon layer 70 doped with impurities such as boron or phosphorous is formed all over the surface of this intermediate semiconductor device by the LPCVD method. Further, a Ti and TiN layer is formed all over the surface of this poly silicon 70 by spattering. After that, this formed Ti and TiN layer is allowed to react upon the poly silicon layer 70 by the RTA (rapid thermal annealing) method. After that, the non-reaction Ti and TiN layer is etched by sulfuric acid and peroxide based processing. Further, when all the Ti and TiN layer is so designed as to change to the TiSi$_2$ layer 72 perfectly, due to the reaction upon the poly silicon layer 70, it is possible to eliminate this sulfuric acid and peroxide based processing.

Further, in order to reduce the contact resistance between an electrode wire piece 78 (described later) and the TiSi$_2$ layer piece 72, all over the uppermost surface of the intermediate semiconductor device is etched by applying a voltage to a silicon substrate 10. That is, as pre-process of forming a barrier metal layer 74 and a wiring layer 76, a reverse spattering processing is performed. After that, the barrier metal layer 74 formed of TiN and the wiring layer 76 formed of Al are formed all over the surface of this intermediate semiconductor device by spattering. By this process, it is possible to obtain an intermediate semiconductor device as shown in FIG. 16.

Figure 17:
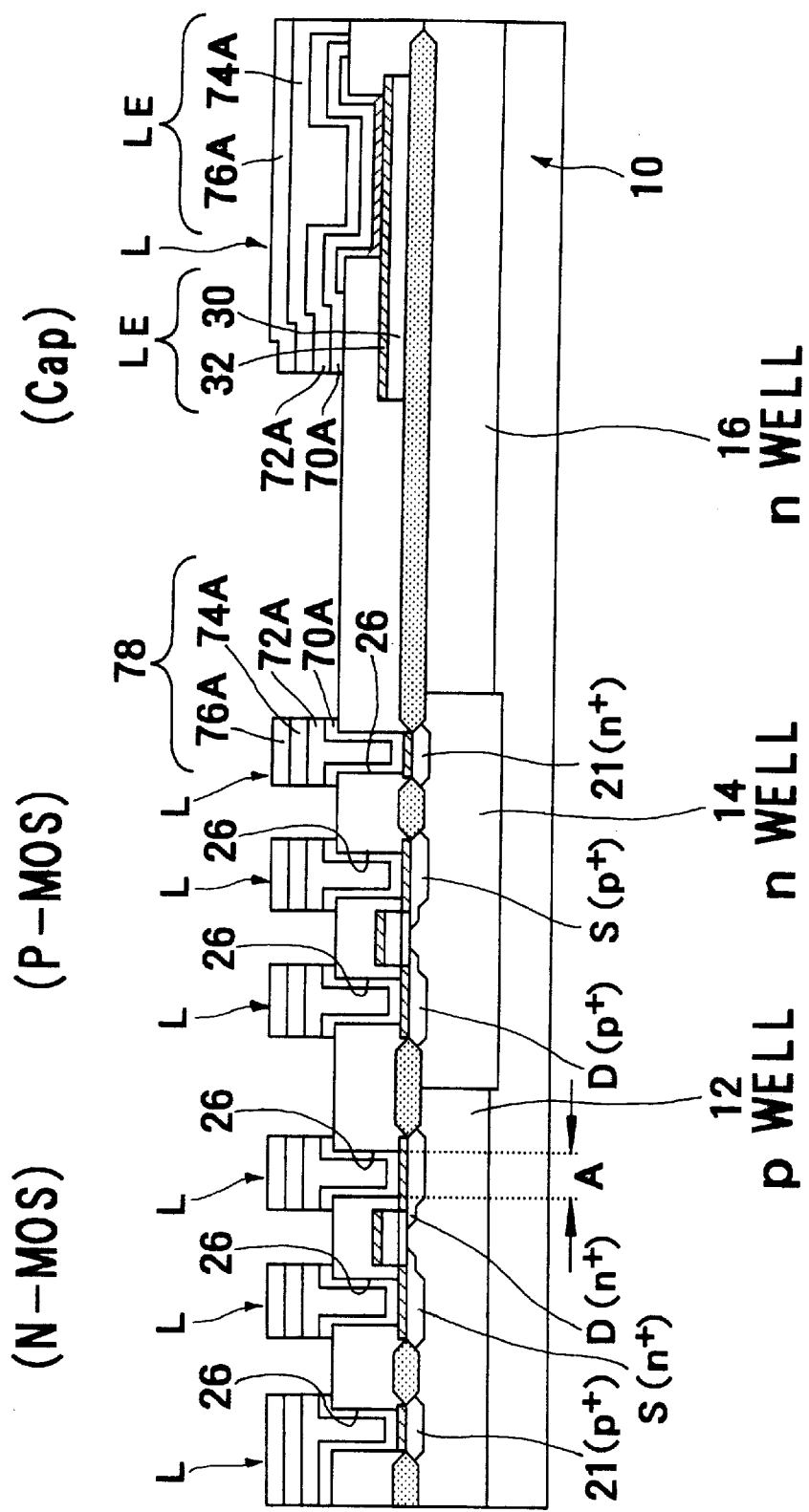
FIG. 17 is a cross-section view showing the third embodiment of the semiconductor device according to the present invention.
Figure 18:
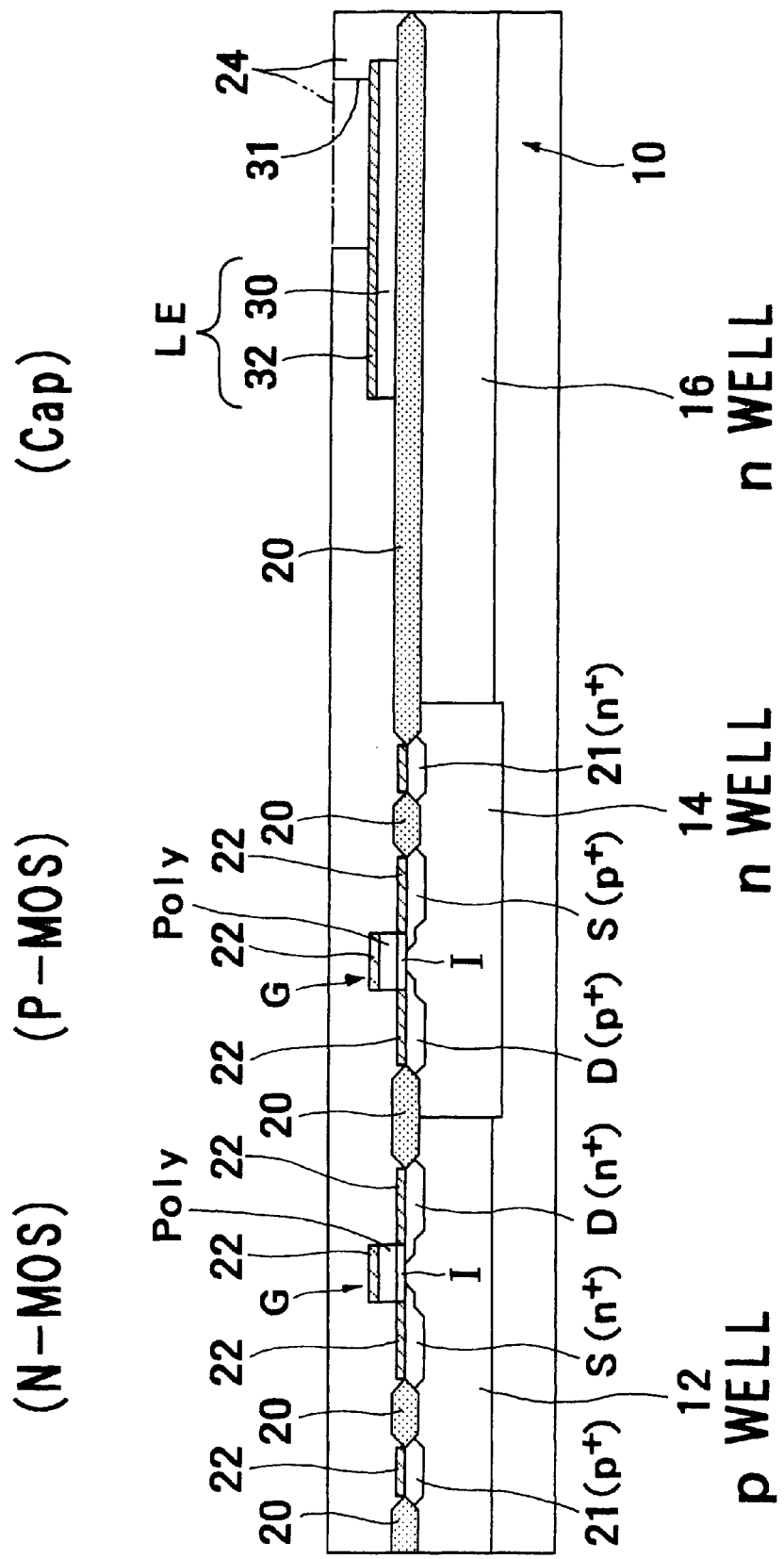
FIGS. 18 to 21 are cross-sectional views each for assistance in explaining a part of the process of manufacturing a prior art semiconductor device.
Figure 19:
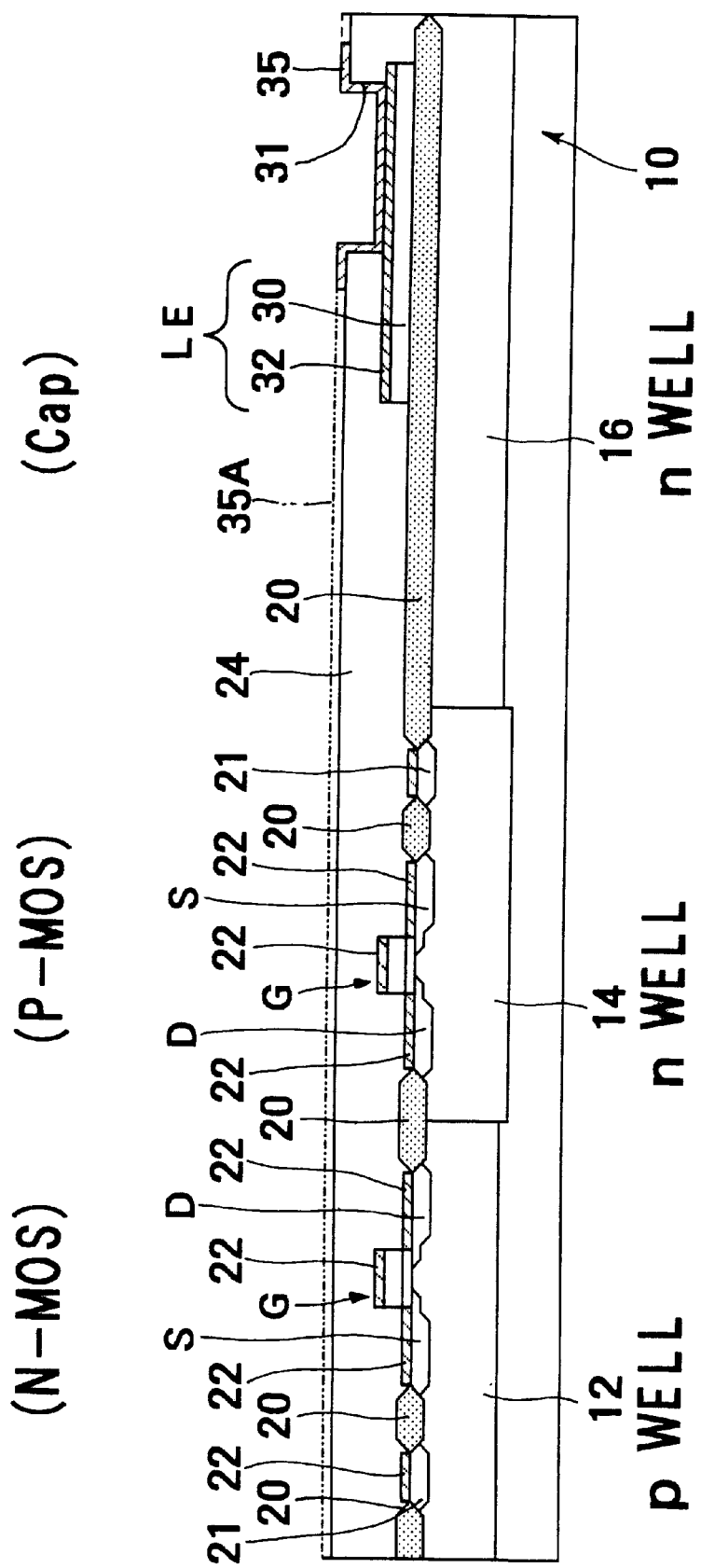

Further, as understood by FIG. 17, the poly silicon layer 70, the TiSi$_2$ layer 72, the barrier metal layer 74 and the wiring layer 76 are all are etched into a predetermined pattern, respectively by the photo-lithography and RIE. By this etching, it is possible to form a multi-layer body L composed of a poly silicon layer piece 70A, a TiSi$_2$ layer piece 72A, a barrier metal layer piece 74A, and a wiring layer piece 76A. The electrode wire pieces 78 of the MOS transistors formed on the left side in FIG. 17 and the upper electrode UE of the capacitor Cap formed on the right side in the same drawing can be formed by the barrier metal layer piece 74A and the wiring layer piece 76A among these pieces. On the basis of the above-mentioned process, it is possible to obtain an intermediate semiconductor device as shown in FIG. 17.

As described above, in this third embodiment, as understood by FIG. 16, after the TiSi$_2$ layer 72 has been formed but before the barrier metal layer 74 and the wiring layer 76 are formed, the uppermost surface of the semiconductor device is etched by applying a voltage to the silicon substrate 10 as pre-processing. In this case, however, since the capacitor dielectric film 35 is covered with the poly silicon layer 70 and the TiSi$_2$ layer 72, it is possible to prevent the capacitor dielectric film 35 from being damaged during the etching process.

In addition, as understood by FIG. 17, in this third embodiment, the poly silicon layer 52 is used as the contact material of the holes 26 of the MOS transistors in the same way as with the case of the second embodiment. That is, since the poly silicon layer 52 is buried in the holes 26, it is unnecessary to bury the wiring layer 42 of Al in the holes 26, being different from the first embodiment. Therefore, in this third embodiment, the hole width A of the hole 26 can be reduced. In practice, the hole width A of at least 0.8 µm is necessary to bury Al in the hole 26 in the case of the first embodiment. On the other hand, the hole width A of 0.5 µm is sufficient in the case of this third embodiment in the same way as with the case of the second embodiment.

In addition, as understood by FIG. 17, when the electrode wire pieces 78 of the MOS transistors and the upper electrode UE of the capacitor are etched into a predetermined pattern, respectively, since the poly silicon layer 70 and the TiSi$_2$ layer 72 can be both etched simultaneously, the number of the times of the photo-lithography and RIE is only once, so that the number of manufacturing steps can be reduced. In addition, since the photolithography and RIE can be performed only once, it is possible to eliminate the margin or allowance H for aligning the barrier metal layer pieces 74A and the wiring layer pieces 76A with the poly silicon layer pieces 70A and the TiSi$_2$ layer pieces 72A, respectively, being different from the second embodiment. Further, since the alignment margin H can be eliminated, it is possible to narrow the spaces between two of the ohmic contact region 21, the source diffusion region S, the drain diffusion layer D, and the gate electrode G of the MOS transistors, respectively.

(4th Embodiment)

A fourth embodiment of the semiconductor device according to the present invention will be described hereinbelow with reference to FIGS. 23 to 28.

The feature of this fourth embodiment is to further improve the feature of the first embodiment, that is, to use an amorphous silicon layer 80 doped with boron as a conductive protection film.

Figure 23:
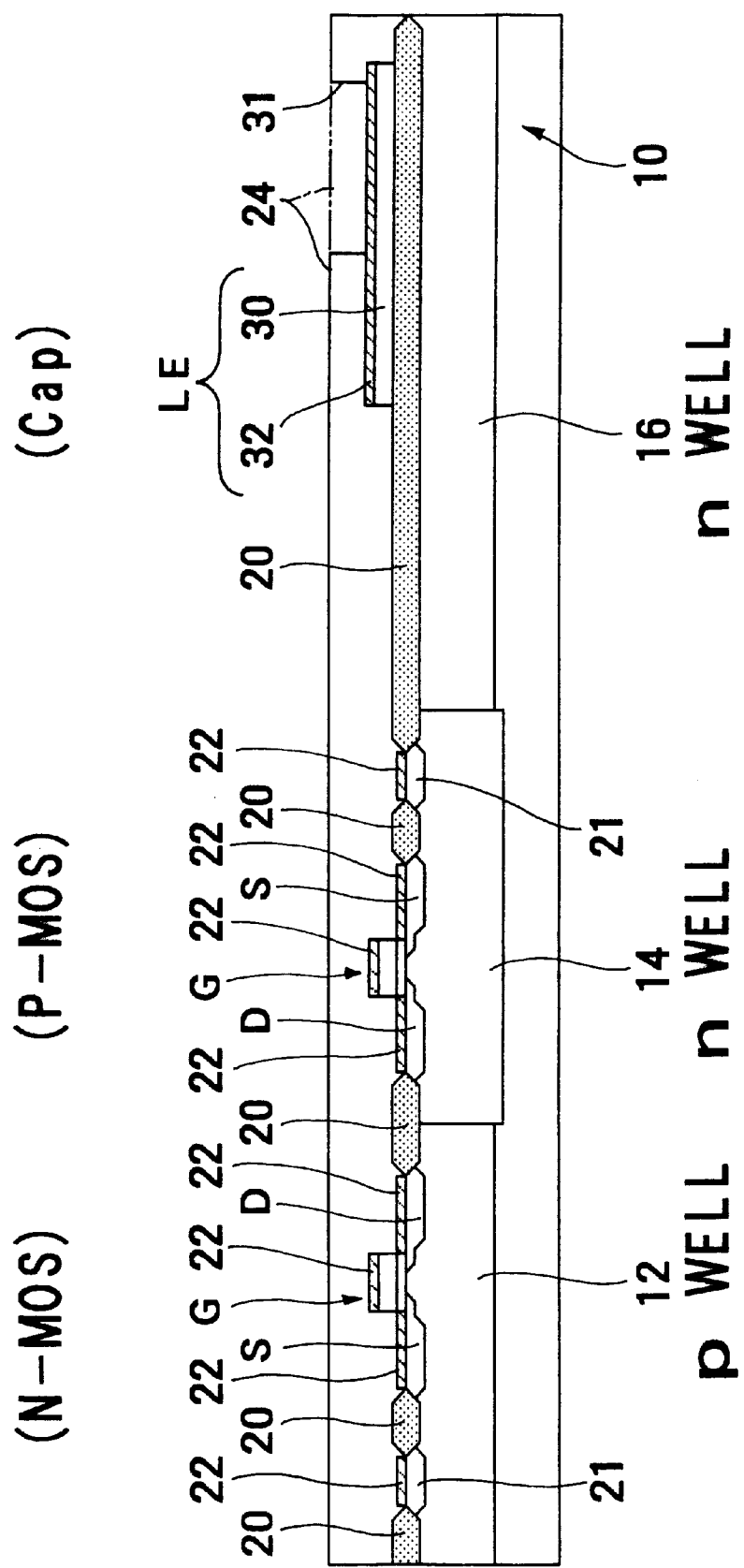
FIGS. 23 to 27 are cross-sectional views each for assistance in explaining a part of the process of manufacturing a fourth embodiment of the semiconductor device according to the present invention.

FIG. 23 is a cross-sectional view showing the intermediate semiconductor device which is substantially the same as the intermediate semiconductor device of the first embodiment shown in FIG. 2. Further, the manufacturing process for obtaining the intermediate semiconductor device shown in FIG. 23 is the same as that of the first embodiment, so that the similar description thereof is omitted herein.

Figure 24:
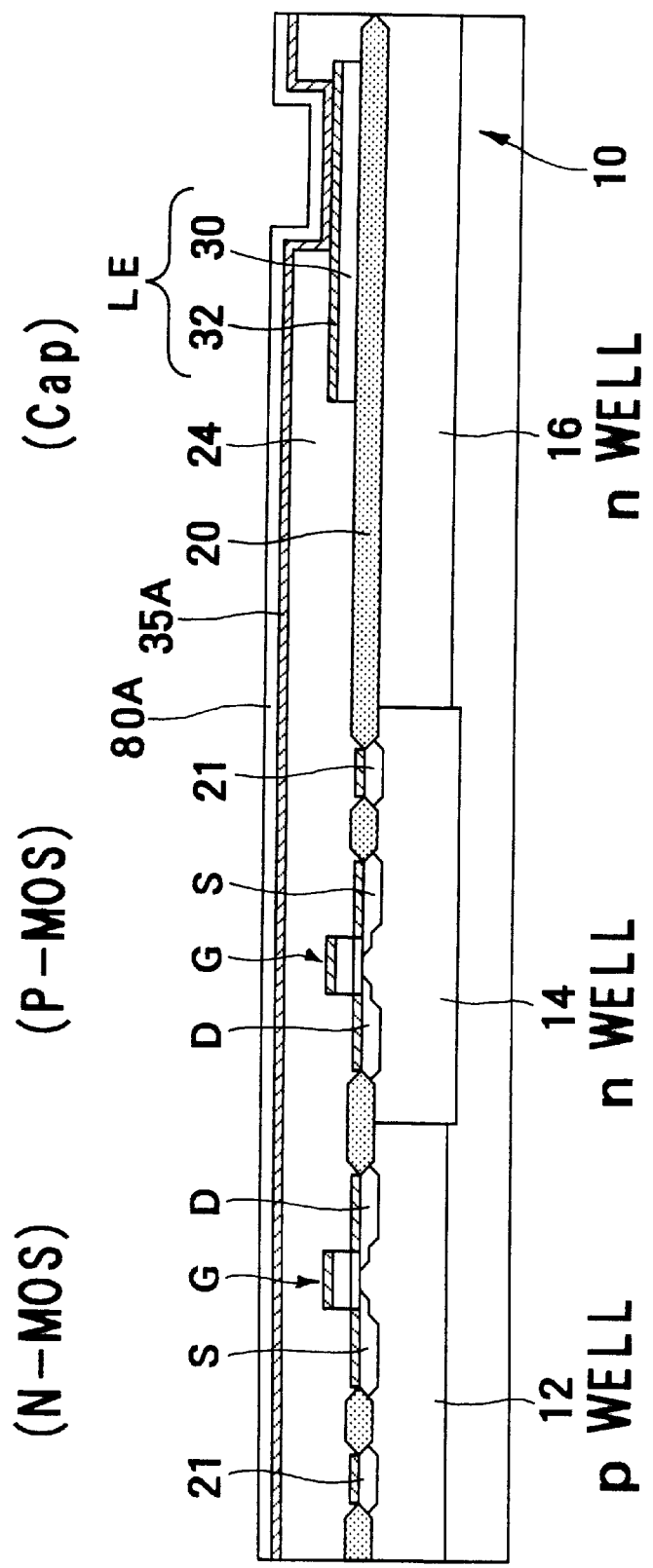

As understood by FIG. 24, the Si$_3$N$_4$ layer 35A is formed all over the surface of the intermediate semiconductor device, that is, all over the surfaces of the SiO$_2$ film 24 and the silicide film 32 of the intermediate semiconductor device by the LPCVD method. Further, a born-doped amorphous silicon layer BOA is formed all over the surface of the Si$_3$N$_4$ layer 35A by the LPCVD. That is, the amorphous silicon layer 80A is formed by doping boron at a high concentration. The reason why boron is doped is to reduce the resistance of the amorphous silicon layer 80A. The preferable boron concentration is more than $1 \times 10^{20}$ cm$^{-3}$. However, since there exists no upper limit from the theoretical standpoint, the more preferable boron concentration is $5 \times 10^{21}$ cm$^{-3}$. By this process, it is possible to obtain an intermediate semiconductor device as shown in FIG. 24.

Figure 25:
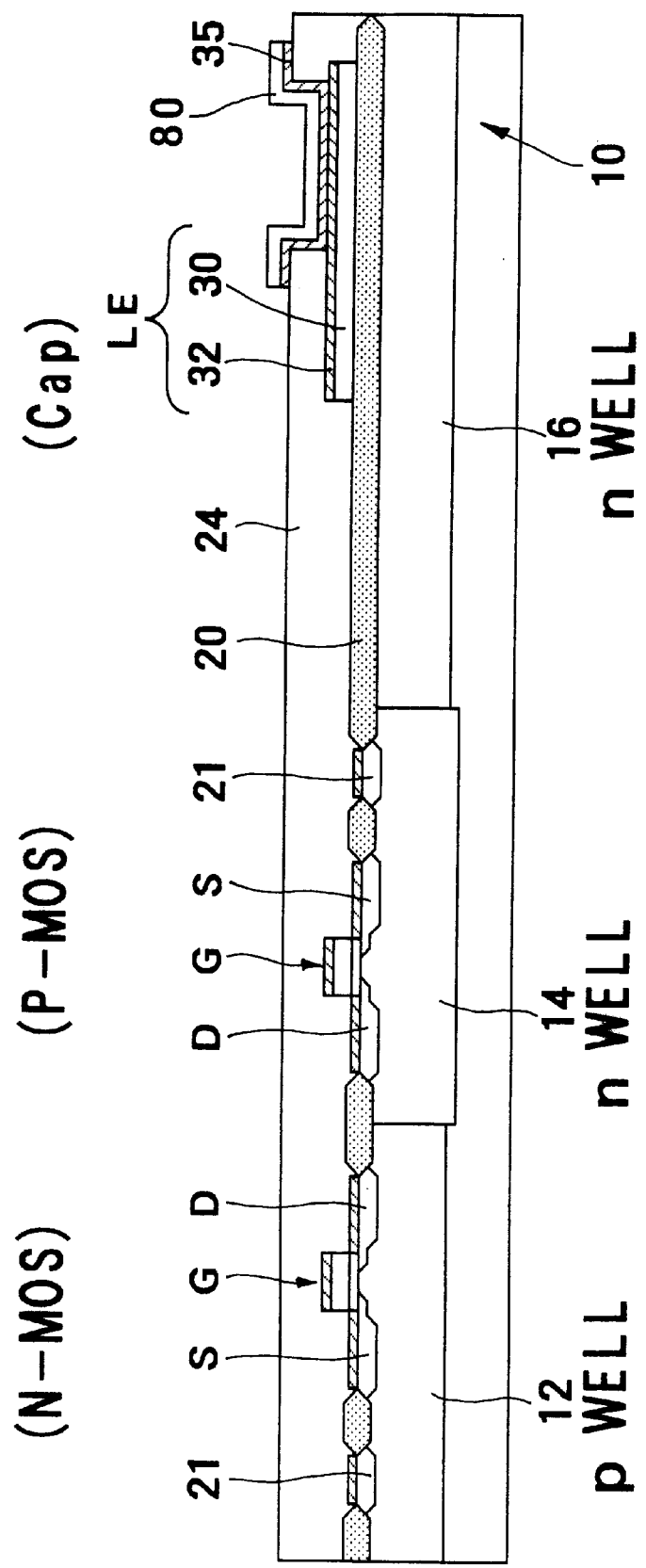

Further, as understood by FIG. 25, the Si$_3$N$_4$ layer 35A and the amorphous silicon layer 80 are both removed by the photo-lithography and RIE, except the region at which the capacitor Cap is to be formed, to leave the same layers as the capacitor dielectric film 35 and the amorphous silicon layer 80, respectively. On the basis of the above-mentioned process, it is possible to obtain an intermediate semiconductor device as shown in FIG. 25.

Figure 26:
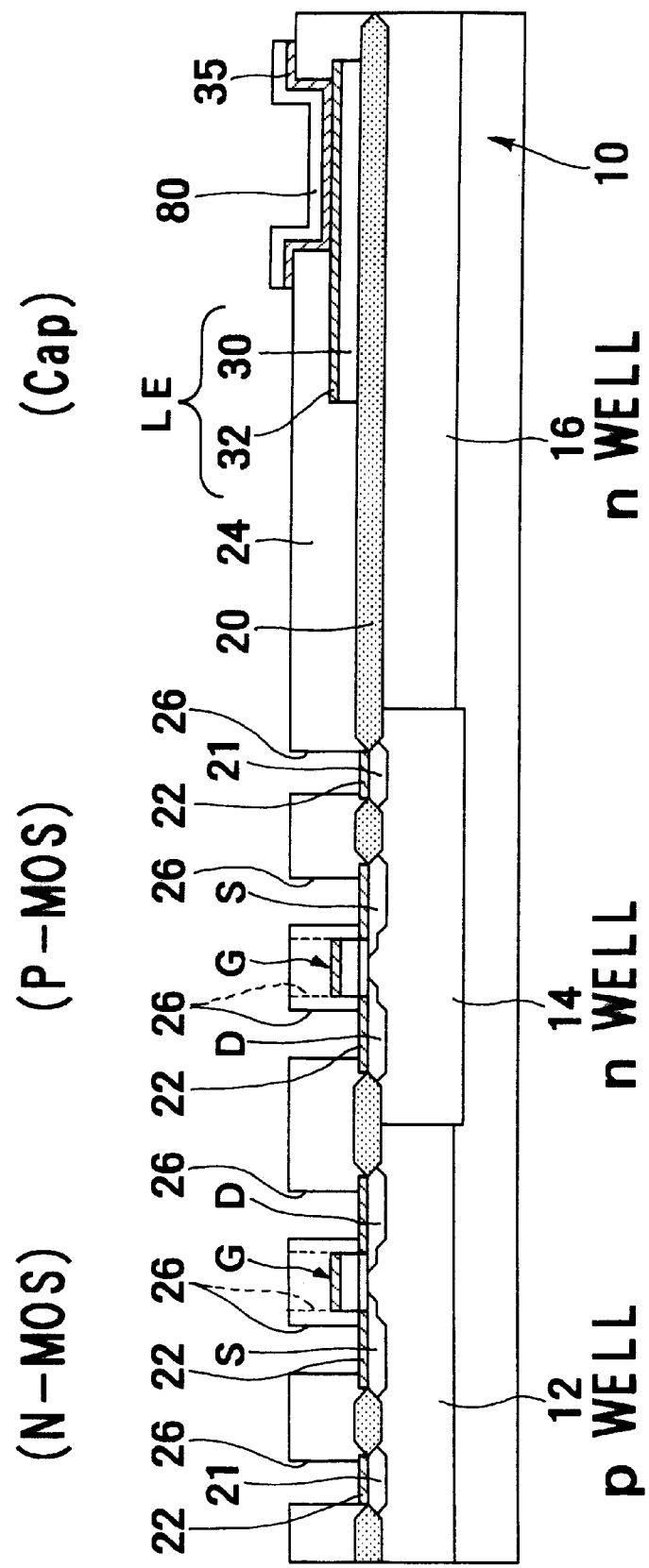

Further, as understood by FIG. 26, the SiO$_2$ film 24 is etched by the photo-lithography and RIE, to form some contact holes 26, so that it is possible to expose the silicide film 22 at the bottoms of these formed contact holes 26. In this case, since it is necessary to remove the resist used for the photo-lithography, this resist is usually removed by sulfuric acid and peroxide based processing. However, the amorphous silicon layer 80 cannot be removed by the sulfuric acid and peroxide based processing. Therefore, it is preferable to select substance not etched by the sulfuric acid and peroxide processing, as the conductive protection film for covering the capacitor dielectric film 35. On the basis of the above-mentioned process, it is possible to obtain an intermediate semiconductor device as shown in FIG. 26. Further, although a hole reaching the gate electrode G has been formed, this gate electrode G is formed at a position not seen by the cross-sectional view shown in FIG. 26.

Further, as understood by FIG. 27, in order to reduce the contact resistance between the electrode wire 44 (described later) and each of the gate electrode G, the source diffusion layer S and the drain diffusion layer D, respectively, all over the surface of the intermediate semiconductor device is cleaned, as pre-process of forming a barrier metal layer 40 and a wiring layer 42. In other words, a reverse spattering processing is performed by etching the uppermost surface of the semiconductor device while applying a voltage of the silicon substrate 10. After that, the barrier metal layer 40 formed of TiN is formed all over the surface of this intermediate semiconductor device by spattering. Successively, in the same way as above, the wiring layer 42 formed of Al is formed all over the surface of this barrier metal layer 40 by spattering. By this process, it is possible to obtain an intermediate semiconductor device as shown in FIG. 27.

Figure 28:
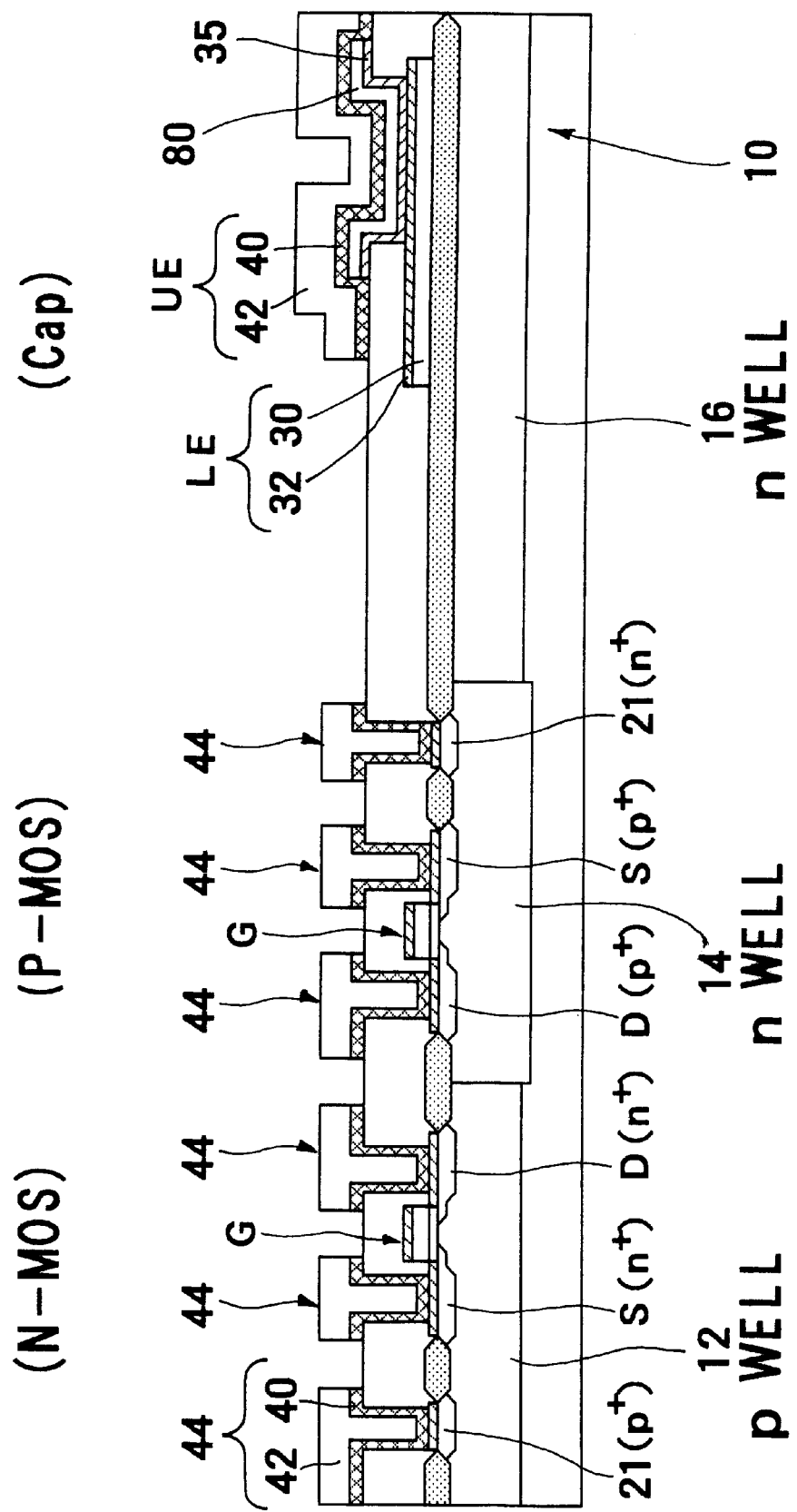
FIG. 28 is a cross-section view showing the fourth embodiment of the semiconductor device according to the present invention.

Further, as understood by FIG. 28, these barrier metal layer 40 and the wiring layer 42 are etched by the photolithography and RIE, to form the electrode wires 44 of the MOS transistors formed on the left side in FIG. 8 and the upper electrode UE of the capacitor Cap formed on the right side in the same drawing. On the basis of the above-mentioned process, it is possible to obtain an intermediate semiconductor device as shown in FIG. 28. In the semiconductor device shown in FIG. 28, although the semiconductor device according to the present invention is completed, after that, the other wiring layers can be further formed one upon another where necessary.

Figure 27:
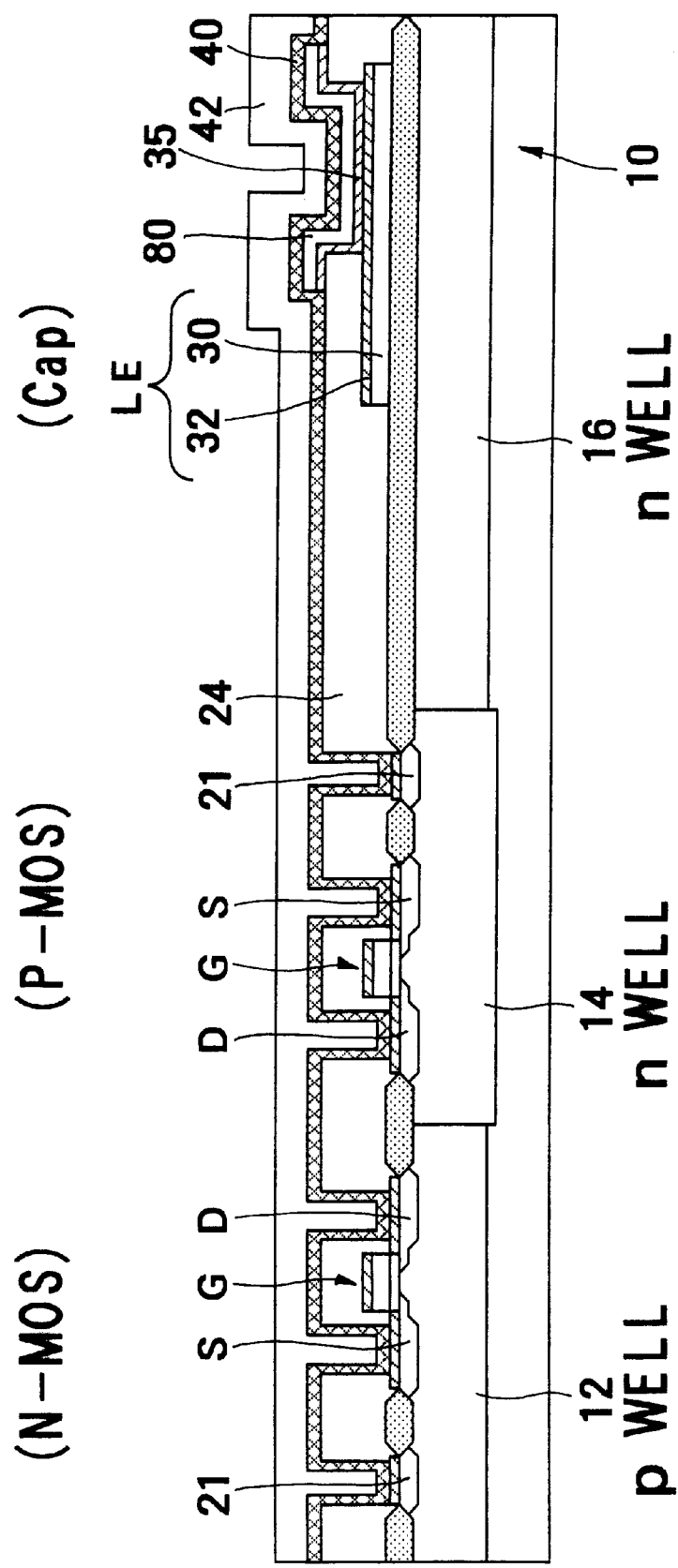

As described above, in the fourth embodiment of the semiconductor device, as understood by FIG. 26, after the ohmic contact region 21, the source diffusion layer S, the drain diffusion layer D and the hole 26 formed for contact with the gate electrode G have been all formed, all over the surface of the intermediate semiconductor device is cleaned, as the pre-process of forming the barrier metal layer 40 and the wiring layer 42 both shown in FIG. 27. In this case, as understood by FIG. 26, the capacitor dielectric film 35 can be protected by the amorphous silicon layer 80. Therefore, owing to the presence of this amorphous silicon layer 80, it is possible to prevent the capacitor dielectric film 35 from being damaged when a voltage is applied to the substrate, with the result that the long-term reliability of the capacitor Cap can be improved. In other words, it is possible to solve such a problem that the surface of the capacitor dielectric film 35 is damaged by the etching process and thereby the space between the lower electrode LE and the upper electrode UE of the capacitor partially changes. As a result, the capacitance and the breakdown voltage of the capacitor can be both uniformalized.

In addition, since the boron-doped amorphous silicon layer 80 is used as the conductive protection film, it is possible to reduce the number of manufacturing steps in comparison with the other embodiments. In more detail, in the case of the first embodiment, as understood by FIG. 5, in order to form the conductive protection film, after the poly silicon layer 36 and the TiSi$_2$ layer 38 have been formed, it is necessary to allow the formed TiSi$_2$ layer to react upon the poly silicon layer 36 by the RTA (rapid thermal annealing) method. In contrast with this, in this fourth embodiment, it is sufficient to form only the boron-doped amorphous silicon layer 80 by the LPCVD method, in order to form the conductive protection film.

(5th Embodiment)

A fifth embodiment of the semiconductor device according to the present invention will be described hereinbelow with reference to FIGS. 29 to 34.

The feature of this fifth embodiment is to further improve the feature of the first embodiment, that is, to use a WSi film 90 of high melting point metal silicide film as a conductive protection film.

Figure 29:
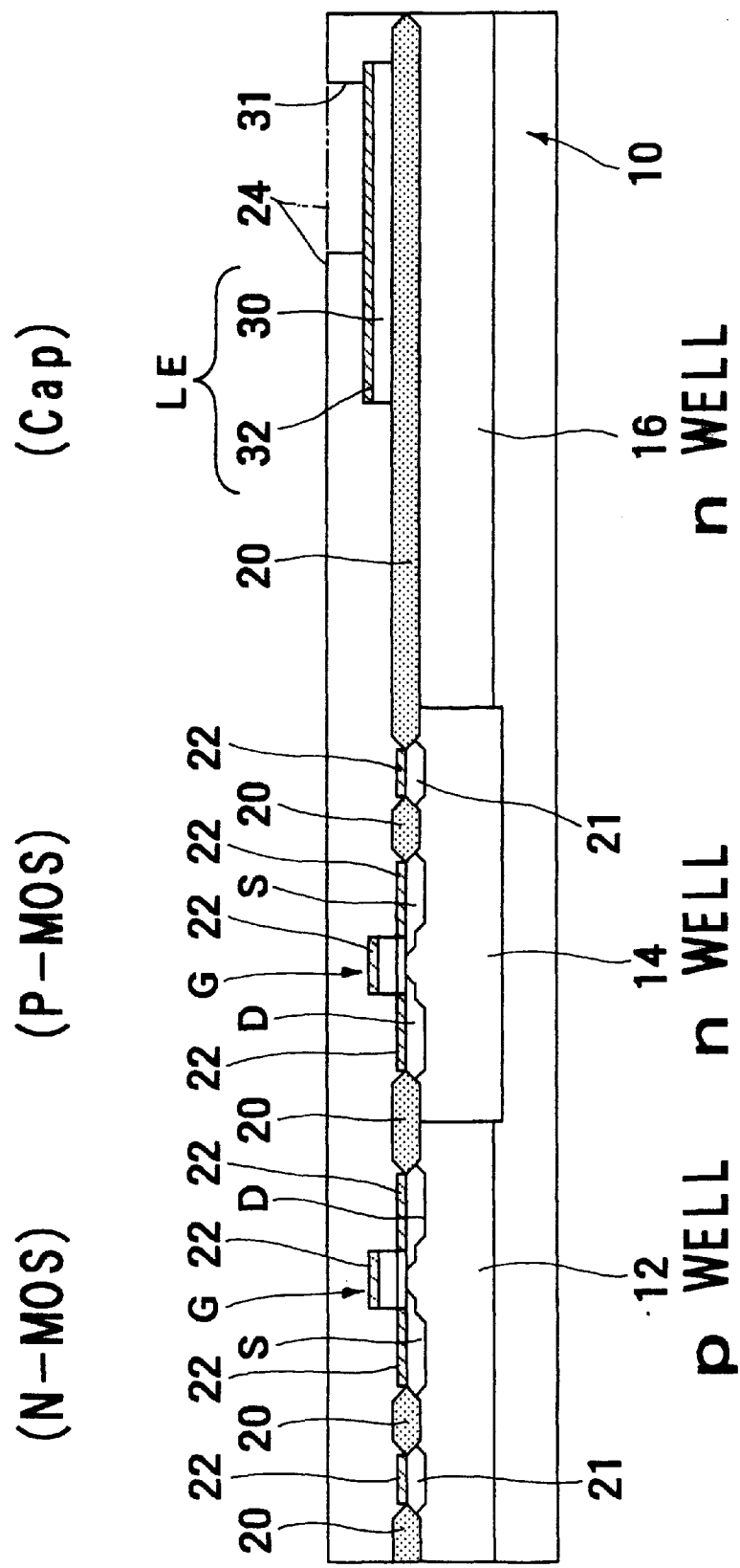
FIGS. 29 to 33 are cross-sectional views each for assistance in explaining a part of the process of manufacturing a fifth embodiment of the semiconductor device according to the present invention.

FIG. 29 is a cross-sectional view showing the intermediate semiconductor device which is substantially the same as the intermediate semiconductor device of the first embodiment shown in FIG. 2. Further, the manufacturing process for obtaining the intermediate semiconductor device shown in FIG. 29 is the same as that of the first embodiment, so that the similar description thereof is omitted herein.

Figure 30:
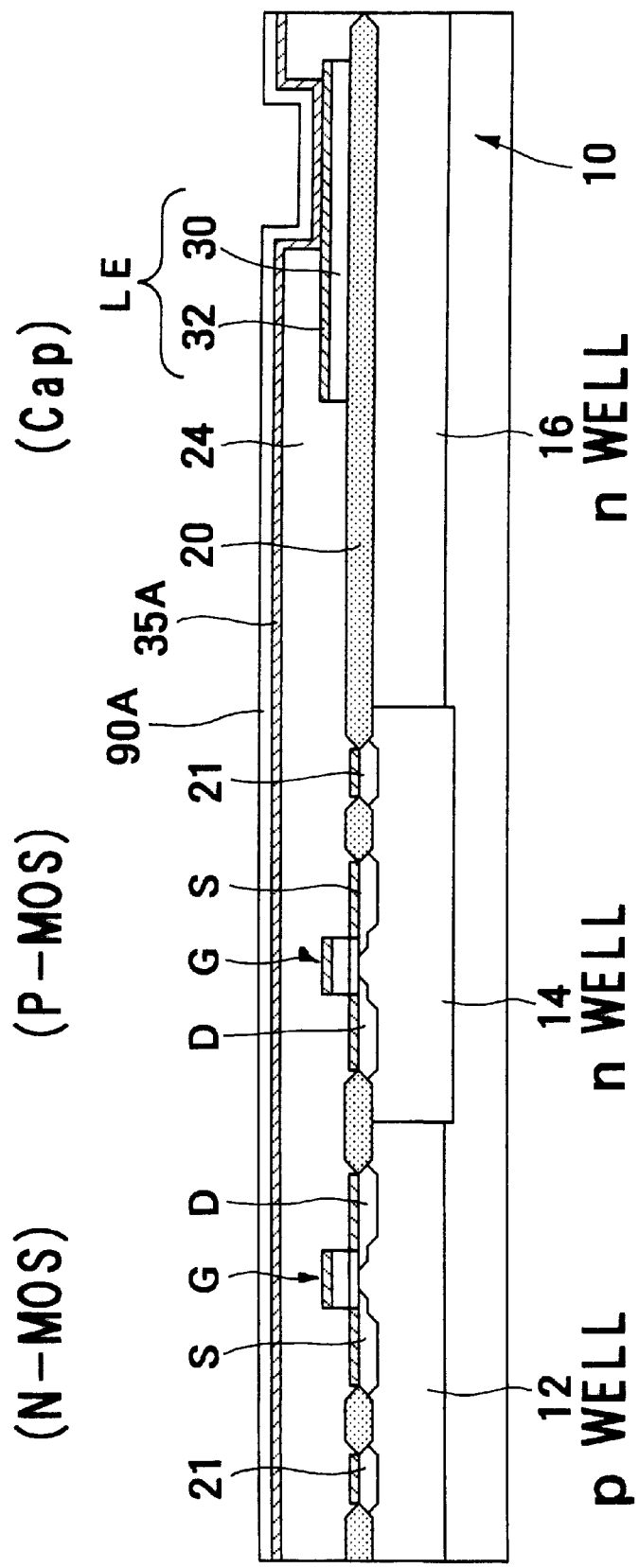

Further, as understood by FIG. 30, the Si$_3$N$_4$ layer 35A is formed all over the surface of the semiconductor device, that is, all over the SiO$_2$ film 24 and the silicide film 32 by the LPCVD (low pressure CVD) method. In addition, the WSi film 90A of high melting point metal silicide film is formed all over the Si$_3$N$_4$ layer 35A by spattering. On the basis of the above-mentioned process, it is possible to obtain the intermediate semiconductor device as shown in FIG. 30.

Figure 31:
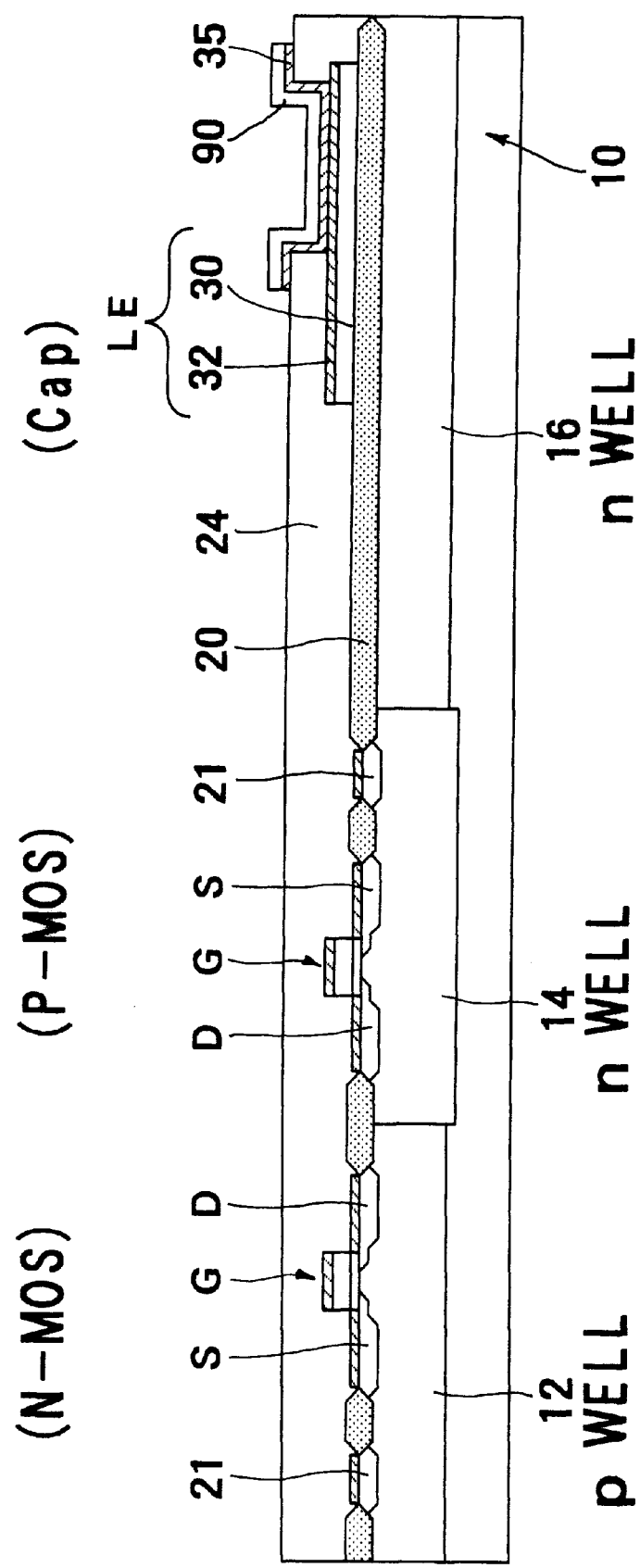

Further, as understood by FIG. 31, the Si$_3$N$_4$ layer 35A and the WSi film 90A are both removed by the photolithography and RIE, except the region at which the capacitor Cap is to be formed, to leave the same layers as the capacitor dielectric film 35 and the WSi film 90, respectively. On the basis of the above-mentioned process, it is possible to obtain an intermediate semiconductor device as shown in FIG. 31.

Figure 32:
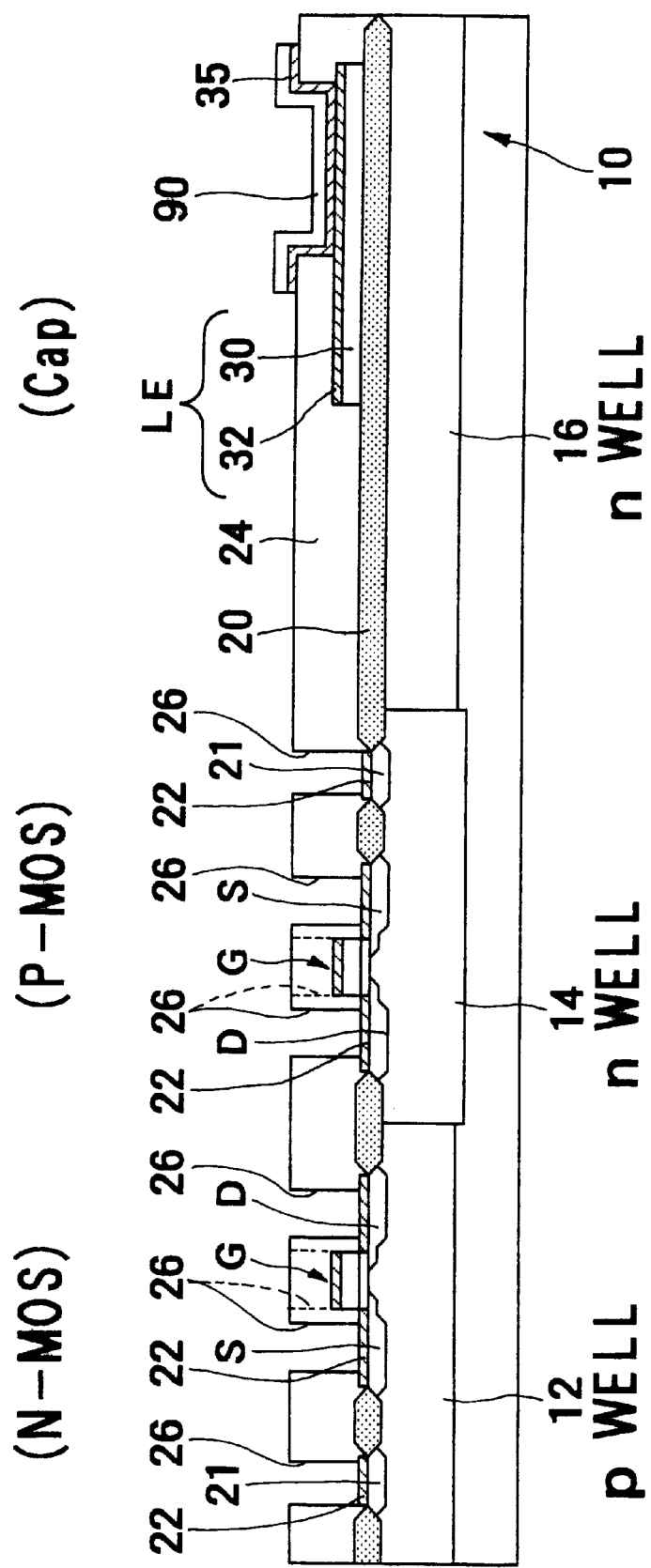

Further, as understood by FIG. 32, the SiO$_2$ film 24 is etched by the photo-lithography and RIE, to form some contact holes 26, so that it is possible to expose the silicide film 22 from the formed contact holes 26, respectively. In this process, since it is necessary to remove a resist used for the photo-lithography, this resist is usually removed by the sulfuric acid and peroxide based processing. In this case, however, the WSi film 90 for covering the capacitor dielectric film 35 cannot be etched by the above-mentioned sulfuric acid and peroxide processing. In other words, it is preferable to select substance not etched by the sulfuric acid and peroxide processing, as the conductive protection film for covering the capacitor dielectric film 35. On the basis of the above-mentioned process, it is possible to obtain an intermediate semiconductor device as shown in FIG. 32. Further, although a hole reaching the gate electrode G has been formed, this gate electrode G is formed at a position not seen by the cross-sectional view shown in FIG. 32.

Further, as understood by FIG. 33, in order to reduce the contact resistance between the electrode wire 44 (described later) and each of the gate electrode G, the source diffusion layer S and the drain diffusion layer D, respectively, all over the surface of the intermediate semiconductor device is cleaned, as pre-process of forming a barrier metal layer 40 and the wiring layer 42. In other words, a reverse spattering processing is performed by etching the uppermost surface of the semiconductor device while applying a voltage of the silicon substrate 10. After that, the barrier metal layer 40 formed of TiN is formed all over the surface of this intermediate semiconductor device by spattering. Successively, in the same way as above, the wiring layer 42 formed of Al is formed all over the surface of this barrier metal layer 40 by spattering. By this process, it is possible to obtain an intermediate semiconductor device as shown in FIG. 33.

Figure 34:
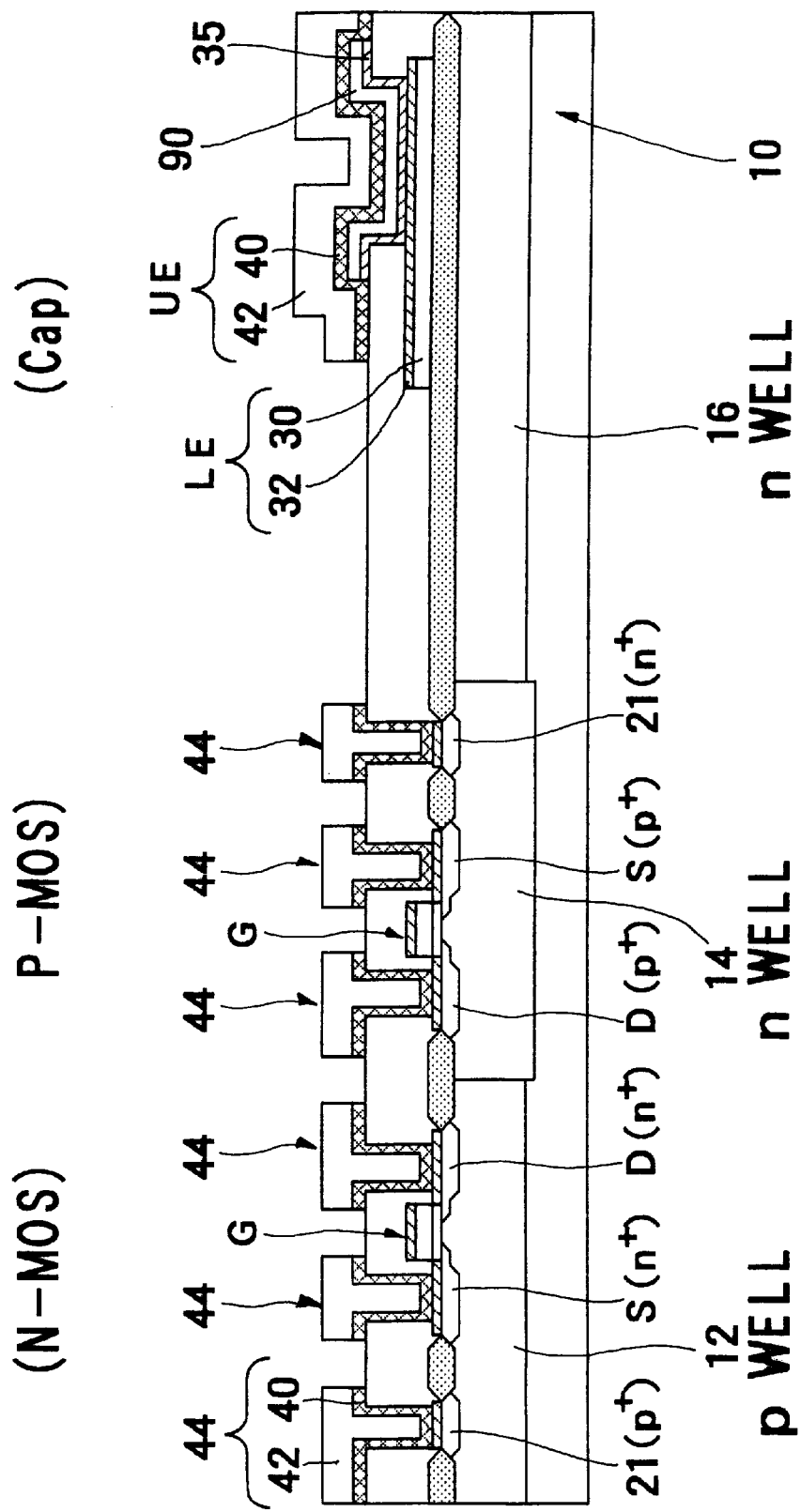
FIG. 34 is a cross-section view showing the fifth embodiment of the semiconductor device according to the present invention.

Further, as understood by FIG. 34, the barrier metal layer 40 and the wiring layer 42 are both etched by the photolithography and RIE, to form the electrode wires 44 of the MOS transistors formed on the left side in FIG. 8 and the upper electrode UE of the capacitor Cap formed on the right side in the same drawing. On the basis of the above-mentioned process, it is possible to obtain an intermediate semiconductor device as shown in FIG. 34. In the semiconductor device shown in FIG. 34, although the semiconductor device according to the present invention is completed, after that, the other wiring layers can be further formed one upon another where necessary.

Figure 33:
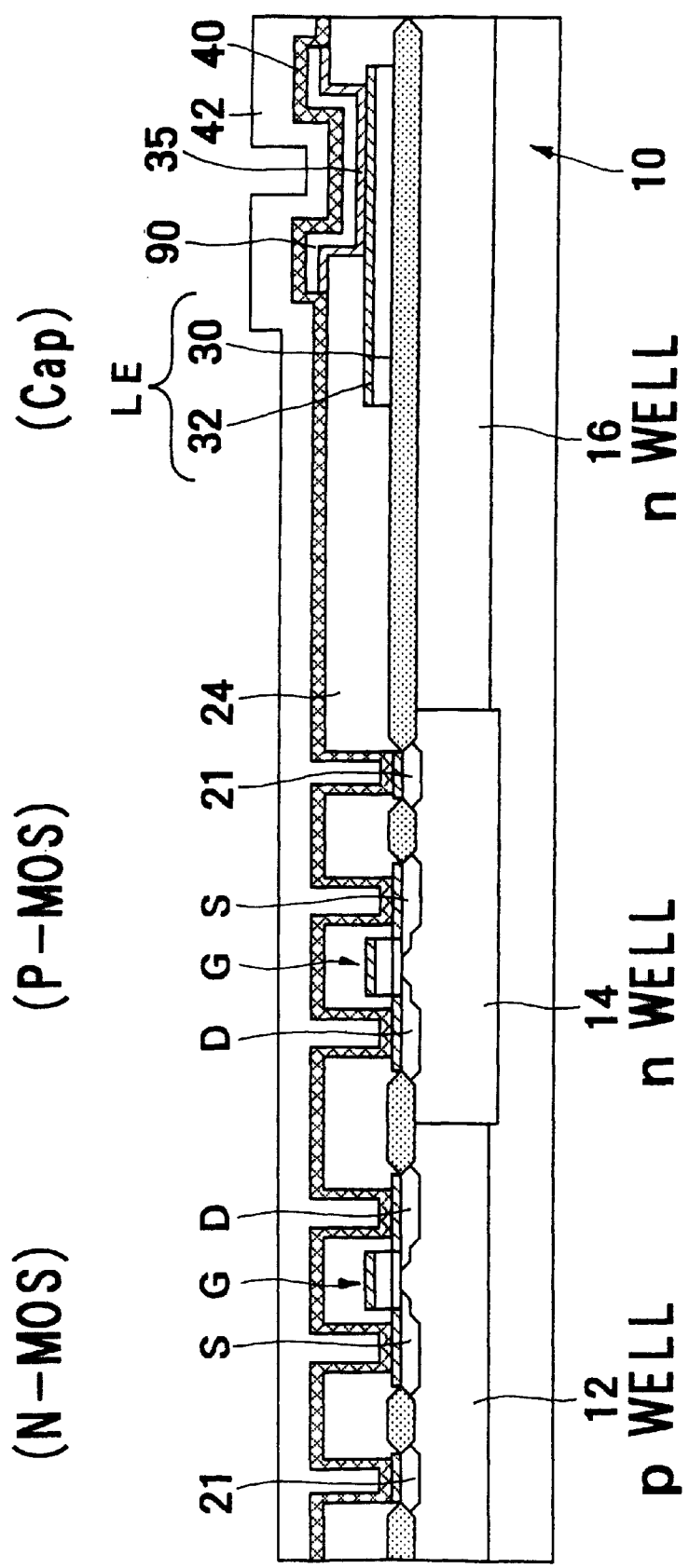

As described above, in the fifth embodiment of the semiconductor device, as understood by FIG. 32, after the ohmic contact region 21, the source diffusion layer S, the drain diffusion layer D, and the hole 36 formed for contact with the gate electrode G have been all formed, all over the surface of the intermediate semiconductor device is cleaned, as the pre-process of forming the barrier metal layer 40 and the wiring layer 42 both shown in FIG. 33. In this case, as understood by FIG. 32, the capacitor dielectric film 35 can be protected by the WSi film 90. Therefore, owing to the presence of this WSi film 90, it is possible to prevent the capacitor dielectric film 35 from being damaged when a voltage is applied to the substrate, with the result that the long-term reliability of the capacitor Cap can be improved. In other words, it is possible to solve such a problem that the surface of the capacitor dielectric film 35 is damaged by the etching process and thereby the space between the lower electrode LE and the upper electrode UE of the capacitor changes partially. As a result, the capacitance and the breakdown voltage of the capacitor can be both uniformalized.

In addition, since the WSi film 90 is used as the conductive protection film, it is possible to reduce the number of the manufacturing steps in the same way as with the case of the fourth embodiment.

Further, without being limited to only the above-mentioned embodiments, the gist of the present invention can be modified in various ways. For instance, any MOS transistors can be manufactured without being limited only to the C (complementary)-MOS transistors as described above. Further, without being limited only to the MOS structure (i.e., metal, oxide film and semiconductor structure), the present invention can be also applied to MIS structure (i.e., metal, insulator film and semiconductor structure). In addition, the n-well 16 can be replaced with the p-well. Further, it is possible to use $CoSi_2$, MoSi, WSi, NiSi, etc. as the high melting point metal silicide film, instead of the $TiSi_2$ layers 38, 58 and 72.

Further, the amorphous silicon layer 80 used for the fourth embodiment can be replaced with the poly silicon or the poly silicon doped with impurities. In other words, it is adequate as far as the capacitor dielectric film 35 can be covered by a conductive protection film so as to prevent the same film 35 from being damaged during cleaning of the semiconductor device.

Further, the cleaning performed before the upper electrode of the capacitor is formed is not limited only to the reverse spattering. For instance, in the status as shown in FIG. 6, it is possible to clean the semiconductor device by use of a solution for selectively etching the high resistance oxide layer (which has already formed selectively on the surface of the silicide film 22), while suppressing the etching rate to the silicide film 22. As the solution as described above, for instance, there exists hydrofluoric acid (HF) liquid diluted by solution of aqueous ammonia fluoride. In other words, when pure hydrofluoric acid (HF) liquid is used, since the silicide film 22 is also etched, it is necessary to dilute the HF liquid by solution of aqueous ammonia fluoride in order to suppress the etching rate to the silicide film 22. Further, solution containing organic carboxylic acid salt, dimethyl formamide and compound fluoride can be used. In the case where the silicide film 22 is cleaned by use of the above-mentioned solution, if the capacitor dielectric film 35 is exposed, this film is inevitably damaged. In the present invention, however, since the capacitor dielectric film 35 is covered with the $TiSi_2$ layer 38 of conductive protection film, it is possible to prevent the damage of the capacitor dielectric film.

As described above, in the semiconductor device according to the present invention, since a conductive protection film is formed on the dielectric film of the capacitor, when the substrate is cleaned before the upper electrode of the capacitor is formed, it is possible to protect the capacitor dielectric film by this conductive protection film. As a result, the damage caused when the capacitor dielectric film is cleaned can be effectively prevented and thereby the mal-insulation of the capacitor can be prevented, with the result that it is possible to improve the long-term reliability of the semiconductor device.

What is claimed is:

1. A semiconductor device which comprises:
   an MIS transistor including:
   a source diffusion layer;
   a drain diffusion layer;
   a gate electrode formed above a channel between said source diffusion layer and said drain diffusion layer;
   at least two silicide film pieces formed on said source diffusion layer and said drain diffusion layer, respectively; and
   a wire electrode connected to at least one of said source diffusion layer and said drain diffusion layer via said silicide film piece; and
   a capacitor including:
   a lower electrode;
   a capacitor dielectric film formed on said lower electrode;
   a conductive protection film formed of substance not etched by sulfuric acid and peroxide processing on said capacitor dielectric film; and
   an upper electrode formed on said conductive protection film.

2. The semiconductor device of claim 1, wherein said wire electrode of said MIS transistor is formed on said silicide film piece, after a cleaning have been performed for surfaces of said silicide film pieces.

3. The semiconductor device of claim 2, wherein said conductive protection film of said capacitor is formed so as to cover and protect a surface of said capacitor dielectric film during said cleaning.

4. The semiconductor device of claim 1, wherein said conductive protection film is formed of material selected from the group consisting of high melting point metal silicide, amorphous silicon and poly silicon, or by a lamination layer of these materials.

5. The semiconductor device of claim 1, wherein said conductive protection film formed between said capacitor dielectric film and said upper electrode is a high melting point metal silicide film formed by reaction due to heat treatment between a poly silicon layer formed on said capacitor dielectric film and a high melting point metal film formed on the poly silicon layer.

6. The semiconductor device of claim 5, wherein said MIS transistor comprises:

a plurality of poly silicon layer pieces formed into a predetermined pattern, respectively after having been buried in contact holes above said source diffusion layer and said drain diffusion layer; and high melting point metal silicide film pieces selectively formed on said poly silicon layer pieces, respectively; and wherein said wire electrode is formed on said high melting point metal silicide film piece, after a surface of the semiconductor device has been cleaned by etching while applying a voltage to a substrate of the semiconductor device.

7. The semiconductor device of claim 6, wherein:

the poly silicon layer formed on said capacitor dielectric film and the poly silicon layer buried in the holes of the MIS transistor are formed as the same layer; and the high melting point metal silicide film formed on the poly silicon layer of said capacitor and the high melting point metal silicide film pieces formed on the poly silicon layer pieces of said MIS transistor are formed as the same layer.

8. The semiconductor device of claim 7, wherein said upper electrode has a margin for the high melting point metal silicide film of said capacitor to prevent the high melting point metal silicide film of said capacitor from being damaged due to mismatch caused when said upper electrode is etched, and said wire electrode has a margin for the high melting point metal silicide film pieces of said MIS transistor to prevent the high melting point metal silicide film pieces of said MIS transistor from being damaged due to mismatch caused when said wire electrode is etched.

9. The semiconductor device of claim 5, wherein:

said MIS transistor is formed with a transistor poly silicon layer piece, a transistor high melting point metal silicide film piece, a transistor barrier metal layer piece, and a transistor wiring layer piece on each of said source diffusion layer and said drain diffusion layer, respectively;

the transistor barrier metal layer piece and the transistor wiring layer piece constitute said wiring electrode;

the transistor poly silicon layer piece, the transistor high melting point metal silicide film piece, the transistor barrier metal layer piece, and the transistor wiring layer piece are all patterned by self-alignment; and the transistor barrier metal layer is formed after a surface of the high melting point metal silicide film formed under the transistor barrier metal layer has been cleaned by etching while applying a voltage to a substrate of the semiconductor device.

10. The semiconductor device of claim 9, wherein:

said capacitor is formed with a capacitor poly silicon layer piece, a capacitor high melting point metal silicide film piece, a capacitor barrier metal layer piece, and a capacitor wiring layer piece;

the capacitor poly silicon layer piece and the capacitor high melting point metal silicide film piece constitute said conductive protection film;

the capacitor barrier metal layer piece and the capacitor wiring layer piece constitute said upper electrode;

the capacitor poly silicon layer piece, the capacitor high melting point metal silicide film piece, the capacitor barrier metal layer piece, and the capacitor wiring layer piece are all patterned by self-alignment; and the capacitor barrier metal layer is formed after the surface of the high melting point metal silicide film formed under the capacitor barrier metal layer has been cleaned by etching while applying the voltage to the substrate of the semiconductor device.

11. The semiconductor device of claim 1, wherein said wiring electrode of said MIS transistor and said upper electrode of said capacitor are formed by the same layer.

12. The semiconductor device of claim 1, wherein said lower electrode is composed of a poly silicon layer and a silicide film formed on the poly silicon layer.

13. The semiconductor device of claim 1, wherein said upper electrode is composed of a barrier metal layer and a wiring layer formed on the barrier metal layer.

14. The semiconductor device of claim 1, wherein said gate electrode of said MIS transistor and said lower electrode of said capacitor are formed as the same layer.

15. The semiconductor device of claim 1, wherein said conductive protection film is formed of amorphous silicon doped with impurity.

16. The semiconductor device of claim 15, wherein said impurity is boron and the boron concentration is more than $1 \times 10^{20}$ cm$^{-3}$.

17. The semiconductor device of claim 16, wherein the boron concentration is $5 \times 10^{21}$ m$^{-7}$.

* * * * *